US012529963B2

United States Patent
Wiener et al.

(10) Patent No.: US 12,529,963 B2
(45) Date of Patent: Jan. 20, 2026

(54) FAST UNIFORMITY DRIFT CORRECTION

(71) Applicant: ASML Holding N.V., Veldhoven (NL)

(72) Inventors: Roberto B. Wiener, Ridgefield, CT (US); Kalyan Kumar Mankala, Bethel, CT (US); Todd R. Downey, Monroe, CT (US)

(73) Assignee: ASML Holding N.V., Veldhoven (NL)

( * ) Notice: Subject to any disclaimer, the term of this patent is extended or adjusted under 35 U.S.C. 154(b) by 93 days.

(21) Appl. No.: 18/262,467

(22) PCT Filed: Jan. 16, 2022

(86) PCT No.: PCT/EP2022/050819
§ 371 (c)(1),
(2) Date: Jul. 21, 2023

(87) PCT Pub. No.: WO2022/161795
PCT Pub. Date: Aug. 4, 2022

(65) Prior Publication Data
US 2024/0319608 A1  Sep. 26, 2024

Related U.S. Application Data

(60) Provisional application No. 63/144,798, filed on Feb. 2, 2021, provisional application No. 63/142,581, filed on Jan. 28, 2021.

(51) Int. Cl.
*G03F 7/00* (2006.01)

(52) U.S. Cl.
CPC ...... *G03F 7/70141* (2013.01); *G03F 7/70075* (2013.01); *G03F 7/70133* (2013.01);
(Continued)

(58) Field of Classification Search
CPC ............. G03F 7/70141; G03F 7/70075; G03F 7/70133; G03F 7/7015; G03F 7/70191; G03F 7/7085
See application file for complete search history.

(56) References Cited

U.S. PATENT DOCUMENTS 6,952,253 B2   10/2005   Lof et al.
7,362,413 B2 *  4/2008   Kremer ............... G03F 7/70083
                                                                355/30
(Continued)

FOREIGN PATENT DOCUMENTS

CN   1790170 B    5/2010
CN   105372645 A  3/2016
(Continued)

OTHER PUBLICATIONS

International Search Report and Written Opinion of the International Searching Authority directed to International Patent Application No. PCT/EP2022/050819, mailed Jun. 24, 2022; 15 pages.
(Continued)

*Primary Examiner* — Hung V Nguyen
(74) *Attorney, Agent, or Firm* — Sterne, Kessler, Goldstein & Fox P.L.L.C.

(57) ABSTRACT

Systems, apparatuses, and methods are provided for adjusting illumination slit uniformity in a lithographic apparatus. An example method can include irradiating, by a radiation source, a portion of a finger assembly with radiation. The example method can further include receiving, by a radiation detector, at least a portion of the radiation in response to the irradiating of the portion of the finger assembly. The example method can further include determining, by a processor, a change in a shape of the finger assembly based on the received radiation. The example method can further include generating, by the processor, a control signal configured to modify a position of the finger assembly based on the determined change in the shape of the finger assembly. Subsequently, the example method can include transmitting, by the processor, the control signal to a motion control system coupled to the finger assembly.

14 Claims, 13 Drawing Sheets

(52) U.S. Cl.
CPC ........ *G03F 7/7015* (2013.01); *G03F 7/70191* (2013.01); *G03F 7/7085* (2013.01)

(56) References Cited

U.S. PATENT DOCUMENTS

| | | | |
|---|---|---|---|
| 7,511,799 | B2 | 3/2009 | Tel et al. |
| 8,411,611 | B2 * | 4/2013 | Kwon .................. H04W 40/02 370/315 |
| 8,629,973 | B2 | 1/2014 | Zimmerman et al. |
| 10,156,791 | B2 * | 12/2018 | Bouchoms .......... G03F 7/70783 |
| 11,656,555 | B2 * | 5/2023 | Nath ................... G03F 7/70191 355/67 |
| 2007/0170376 | A1 | 7/2007 | Neerhof et al. |
| 2010/0302525 | A1 * | 12/2010 | Zimmerman ....... G03F 7/70191 355/71 |
| 2011/0235015 | A1 | 9/2011 | Dengel et al. |
| 2012/0262685 | A1 | 10/2012 | Zimmerman |
| 2013/0088700 | A1 | 4/2013 | Kim et al. |
| 2019/0163046 | A1 | 5/2019 | Cho et al. |
| 2020/0133142 | A1 | 4/2020 | Lu et al. |

FOREIGN PATENT DOCUMENTS

| | | |
|---|---|---|
| JP | H11-026379 A | 1/1999 |
| JP | 2000-250226 A | 9/2000 |
| JP | 2005-167232 A | 6/2005 |
| JP | 2007-123888 A | 5/2007 |
| JP | 2010-016376 A | 1/2010 |

OTHER PUBLICATIONS

International Preliminary Report on Patentability directed to International Patent Application No. PCT/EP2022/050819, issued Jul. 31, 2023; 11 pages.

Taiwanese office action directed to Taiwanese patent application No. 111103524, mailed Nov. 5, 2025; 26 pages.

Japanese office action directed to Japanese patent application No. 2023-544369, mailed Nov. 18, 2025; 10 pages.

Japanese search report directed to Japanese patent application No. 2023-544369, mailed Oct. 23, 2025; 33 pages.

* cited by examiner

900

FAST UNIFORMITY DRIFT CORRECTION

CROSS-REFERENCE TO RELATED APPLICATIONS

This application claims priority of U.S. application No. 63/142,581 which was filed on 28 Jan. 2021, and U.S. application No. 63/144,798, which was filed on 2 Feb. 2021, and which are incorporated herein in its entirety by reference.

TECHNICAL FIELD

The present disclosure relates to systems and methods for correcting illumination non-uniformities in lithographic apparatuses and systems.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel (e.g., opposite) to this scanning direction. It is also possible to transfer the pattern from the patterning device to the substrate by imprinting the pattern onto the substrate.

As semiconductor manufacturing processes continue to advance, the dimensions of circuit elements have continually been reduced while the amount of functional elements, such as transistors, per device has been steadily increasing over decades, following a trend commonly referred to as Moore's law. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Extreme ultraviolet (EUV) radiation, for example, electromagnetic radiation having wavelengths of around 50 nanometers (nm) or less (also sometimes referred to as soft x-rays), and including light at a wavelength of about 13.5 nm, can be used in or with a lithographic apparatus to produce extremely small features in or on substrates, for example, silicon wafers. A lithographic apparatus which uses EUV radiation having a wavelength within a range of 4 nm to 20 nm, for example 6.7 nm or 13.5 nm, can be used to form smaller features on a substrate than a lithographic apparatus which uses, for example, radiation with a wavelength of 193 nm.

Methods to produce EUV light include, but are not necessarily limited to, converting a material that has an element, for example, xenon (Xe), lithium (Li), or tin (Sn), with an emission line in the EUV range to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

A lithographic apparatus typically includes an illumination system that conditions radiation generated by a radiation source before the radiation is incident upon a patterning device. The illumination system may, for example, modify one or more properties of the radiation, such as polarization and/or illumination mode. The illumination system may include a uniformity correction system that corrects or reduces non-uniformities (e.g., intensity non-uniformities) present in the radiation. Uniformity correction devices may employ actuated finger assemblies that are inserted into an edge of a radiation beam to correct intensity variations. A spatial breadth of illumination that can be adjusted by a uniformity correction system is dependent on, inter alia, sizes of the finger assemblies and of the actuating devices used to move finger assemblies in the uniformity correction system. Modifying finger parameters from a known working design is not trivial as such modifications can lead to undesirable alterations of one or more properties of a radiation beam.

In order to achieve tolerances of image quality on a patterning device and substrate, an illumination beam having a controlled uniformity is desirable. It is common for an illumination beam to have a non-uniform intensity profile before reflecting off of or transmitting through a patterning device. It is desirable at various stages in a lithographic process that the illumination beam be controlled to achieve improved uniformity. Uniformity can refer to a constant intensity across a pertinent cross section of the illumination beam, but can also refer to the ability to control the illumination to achieve selected uniformity parameters. A patterning device imparts a pattern onto a beam of radiation that is then projected onto a substrate. Image quality of this projected beam is affected by the uniformity of the beam.

Accordingly, it is desirable to control illumination uniformity so that lithographic tools perform lithography processes as efficiently as possible for maximizing manufacturing capacity and yield rates, minimizing manufacturing defects, and reducing cost per device.

SUMMARY

The present disclosure describes various aspects of systems, apparatuses, and methods for adjusting illumination slit uniformity in a lithographic apparatus.

In some aspects, the present disclosure describes a system. The system can include a radiation source configured to generate radiation and transmit the generated radiation towards a finger assembly. The system can further include a radiation detector configured to receive at least a portion of the transmitted radiation. The system can further include a processor configured to determine a change in a shape of the finger assembly based on the received radiation. The processor can be further configured to generate a control signal configured to modify a position of the finger assembly based on the determined change in the shape of the finger assembly. The processor can be further configured to transmit the control signal to a motion control system coupled to the finger assembly.

In some aspects, the determined change in the shape of the finger assembly can include a change in a position of an optical edge of a fingertip of the finger assembly based on a growth of the fingertip in response to an exposure of the fingertip to deep ultraviolet (DUV) radiation or extreme ultraviolet (EUV) radiation.

In some aspects, the radiation source can be configured to transmit the radiation during a wafer exchange operation of a lithographic apparatus. In other aspects, the radiation source can be configured to transmit the radiation during a wafer exposure operation of a lithographic apparatus.

In some aspects, the generated radiation can include a laser curtain and the radiation detector can be configured to receive at least the portion of the transmitted radiation in response to an irradiation of a portion of the finger assembly by the laser curtain. In some aspects, the portion of the finger assembly can include a mechanical edge of a fingertip of the finger assembly disposed separate from an optical edge of the fingertip of the finger assembly.

In some aspects, the received radiation can include radiation reflected from a surface of a fingertip of the finger assembly in response to an irradiation of the surface of the fingertip by the transmitted radiation.

In some aspects, the processor can be further configured to measure a change in a position of a reference mark disposed on the finger assembly based on the received radiation. In some aspects, the processor can be further configured to determine the change in the shape of the finger assembly based on the measured change in the position of the reference mark. In some aspects, the reference mark can be applied to a region of a multi-layer mirror material disposed on a fingertip of the finger assembly. For example, in such aspects, the radiation detector can be configured to sense a reflected portion of an actinic EUV light used during a wafer exposure operation of a lithographic apparatus.

In some aspects, the present disclosure describes an apparatus. The apparatus can include a finger assembly. The finger assembly can include a finger body, a fingertip, a multi-layer mirror material disposed on a surface of the fingertip, and a set of reference marks applied to a region of the multi-layer mirror material. In some aspects, the set of reference marks can include two or more reference marks. In some aspects, the multi-layer mirror material can be configured to reflect, during an exposure operation of a lithographic apparatus, DUV radiation or EUV radiation towards a radiation detector. In some aspects, the multi-layer mirror material can include molybdenum.

In some aspects, the present disclosure describes a method for adjusting illumination slit uniformity in a lithographic apparatus. The method can include irradiating, by a radiation source, a portion of a finger assembly with radiation. The method can further include receiving, by a radiation detector, at least a portion of the radiation in response to the irradiating of the portion of the finger assembly. The method can further include determining, by a processor, a change in a shape of the finger assembly based on the received radiation. The method can further include generating, by the processor, a control signal configured to modify a position of the finger assembly based on the determined change in the shape of the finger assembly. The method can further include transmitting, by the processor, the control signal to a motion control system coupled to the finger assembly.

In some aspects, the determining the change in the shape of the finger assembly can include determining, by the processor, a change in a position of an optical edge of a fingertip of the finger assembly based on a growth of the fingertip in response to an exposure of the fingertip to DUV radiation or EUV radiation.

In some aspects, the irradiating the portion of the finger assembly can include irradiating, by the radiation source, the portion of the finger assembly with the radiation during a wafer exchange operation of the lithographic apparatus. In other aspects, the irradiating the portion of the finger assembly can include irradiating, by the radiation source, the portion of the finger assembly with the radiation during a wafer exposure operation of the lithographic apparatus.

In some aspects, the radiation can include a laser curtain, and the receiving at least the portion of the radiation can include receiving, by the radiation detector, at least the portion of the transmitted radiation in response to irradiating the portion of the finger assembly with the laser curtain. In some aspects, the portion of the finger assembly can include a mechanical edge of a fingertip of the finger assembly disposed separate from an optical edge of the fingertip of the finger assembly.

In some aspects, the receiving at least the portion of the radiation can include receiving, by the radiation detector, radiation reflected from a surface of a fingertip of the finger assembly in response to irradiating the surface of the fingertip with the radiation.

In some aspects, the determining the change in the shape of the finger assembly can include measuring, by the processor, a change in a position of a reference mark disposed on the finger assembly based on the received radiation. In some aspects, the determining the change in the shape of the finger assembly can further include determining, by the processor, the change in the shape of the finger assembly based on the measured change in the position of the reference mark. In some aspects, the reference mark is applied to a region of a multi-layer mirror material disposed on a fingertip of the finger assembly. For example, in such aspects, the method can include sensing, by the radiation detector, a reflected portion of an actinic EUV light used during a wafer exposure operation of a lithographic apparatus.

Further features, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

Figure 1A:
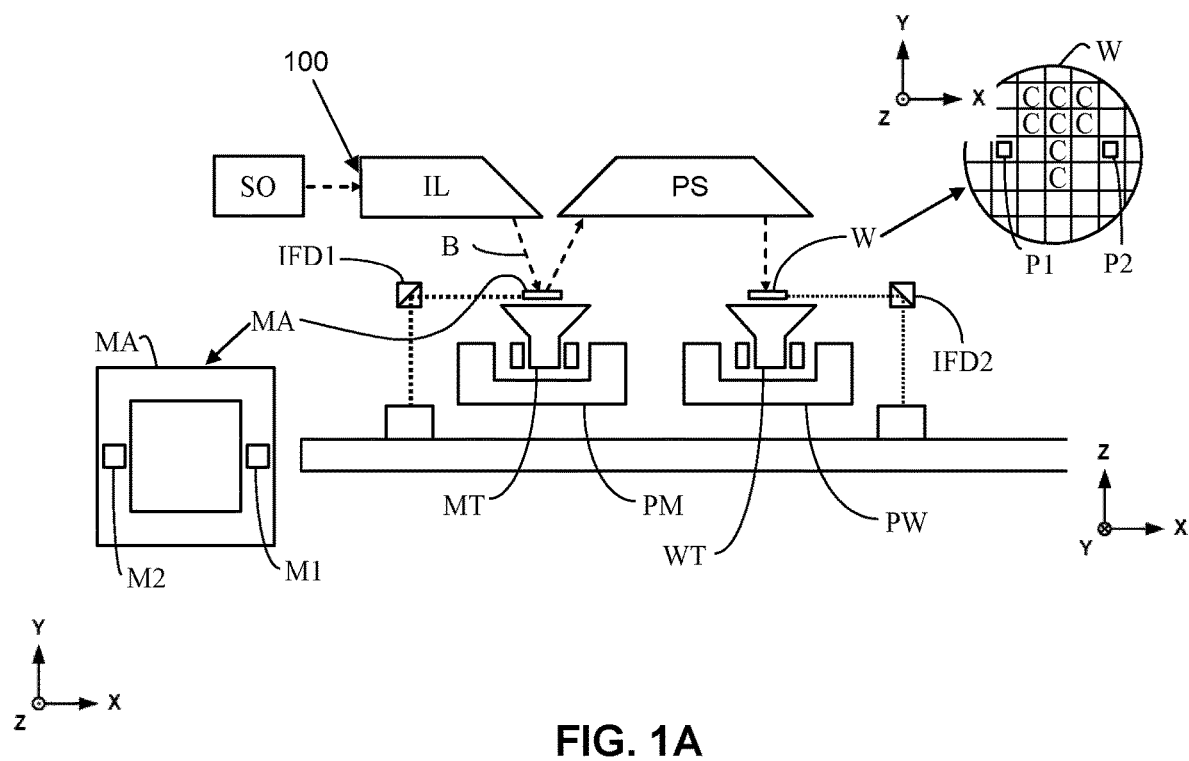
FIG. 1A is a schematic illustration of an example reflective lithographic apparatus according to some aspects of the present disclosure.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Overview

An example illumination uniformity correction system referred to as a "Unicom" can adjust slit uniformity in the cross-scan direction, attenuating illumination "hot spots" by introducing a set of finger assemblies or "fingers" into the illumination slit. The Unicom can be configured to operate in one of two "modes": (1) a first mode that concerns uniformity correction per wafer to correct for illumination effects; and (2) a second mode in which slit uniformity is modified per die to correct for wafer and process effects and in which uniformity correction changes in parallel to stepping dies. As incoming light (e.g., EUV radiation) heats the Unicom finger tips, the unmeasured distance from the Unicom position measurement and the fingertip can change, causing a drift in the slit uniformity. For instance, as power increases in a lithographic apparatus, the expected critical dimension (CD) impact of uniformity drift can increase from about 0.06 nm (<600 W source power) to greater than or equal to about 0.1 nm (≥600 W source power). CD impact can be equal to about 0.3 times the percentage of uniformity. CD uniformity (CDU) requirements can be between about 0.7 nm and about 1.2 nm. In some examples, slit uniformity drift may not be compensated.

In one example, slit uniformity drift can be measured and corrected every about 900 seconds or, in another example, once per wafer lot, introducing uncorrectable CD impact. In some aspects, CD impact can be reduced by performing more frequent measurements. However, each uniformity refresh (UR) measurement can take about 2 seconds and use sensors in the wafer stage. As a result, these measurements cannot be performed in parallel to wafer stage chuck exchanges. Further, to reduce the slit uniformity drift by half, at least two additional uniformity refresh measurements may be needed in the first lot, increasing the lot time for 25 wafers from about 900 seconds to about 904 seconds and thus reducing the overall machine throughput.

In contrast, some aspects of the present disclosure can provide for using a reference measurement close to the fingertip to correct for Unicom uncorrected thermal drift. By periodically measuring a single reference surface in the fingertip, the actual fingertip growth can be measured periodically without requiring a sensor in the wafer stage, thus introducing no throughput impact. To measure and estimate fingertip growth with respect to a position sensor, such as an encoder scale, some aspects of the present disclosure can provide for measuring the change in distance of one or more reference points in or associated with the Unicom fingertip versus an encoder index pulse. In some aspects, the original distance from the Unicom fingertip to the encoder reference mark can be calibrated periodically or measured once during the Unicom build.

In some aspects, the present disclosure can provide for a fingertip sensor that includes a single beam across all finger assemblies, which minimizes the number of sensors. In such aspects, each finger may have to move through its complete travel path until the position of the fingertip is measured. For example, each finger can move through its complete travel path in about 200 ms. As a result, measuring all 28 finger assemblies can take about 6 seconds and thus measurements can be performed in parallel to wafer exchanges.

In some aspects, an algorithm can be used to maximize the number of finger assemblies measured during the lot because wafer chuck exchange time is about 2.5 seconds with about 0.43 seconds of "shadow time" available for Unicom moves. For example, some aspects of the present disclosure can measure only the furthest inserted finger assemblies and the least inserted finger assemblies and interpolate the measurement results. Additionally or alternatively, some aspects of the present disclosure can include etching a mark on the fingertip (or creating a new surface in the fingertip to make this mark) and measuring the displacement of this mark as a function of finger thermal growth.

In some aspects, fingertip growth can be proportional to the change in distance of the chosen reference point in the fingertip assembly versus the encoder index. In some aspects, measurements and adjustments can occur every wafer or every die. In some aspects, "room temperature" or reference distance from the fingertip to the encoder can be calibrated periodically or only once during the build of the fingertip assembly. In some aspects, fingertip growth of less than or equal to about 8 μm can be detected.

In some aspects, the present disclosure provides for adjusting illumination slit uniformity in a lithographic apparatus by, for example: irradiating, by a radiation source, a portion of a finger assembly with radiation; receiving, by a radiation detector, at least a portion of the radiation in response to the irradiating of the portion of the finger assembly; determining, by a processor, a change in a shape of the finger assembly based on the received radiation; generating, by the processor, a control signal configured to modify a position of the finger assembly based on the determined change in the shape of the finger assembly; and transmitting, by the processor, the control signal to a motion control system coupled to the finger assembly.

There are many exemplary aspects to the systems, apparatuses, methods, and computer program products disclosed herein. For example, aspects of the present disclosure provide for decreasing the CD drift and CDU impact from the Unicom from greater than or equal to about 0.1 nm (e.g., for all tool generations with source power greater than about 350 W) to below about 0.06 nm. As CDU requirements can be less than or equal to about 0.6 nm, the 40 percent reduction of CDU impact from about 0.1 nm to about 0.06 nm can be substantial. In another example, aspects of the present disclosure do not require a sensor in the wafer stage and thus there is substantially no throughput impact to reduce CD drift. In yet another example, aspects of the present disclosure do not require sensors (e.g., accurate pressure sensor) outside the Unicom. In still another example, aspects of the present disclosure do not require prior knowledge of finger assembly insertion.

Before describing such aspects in more detail, however, it is instructive to present an example environment in which aspects of the present disclosure can be implemented.

Example Lithographic Systems

Figure 1B:
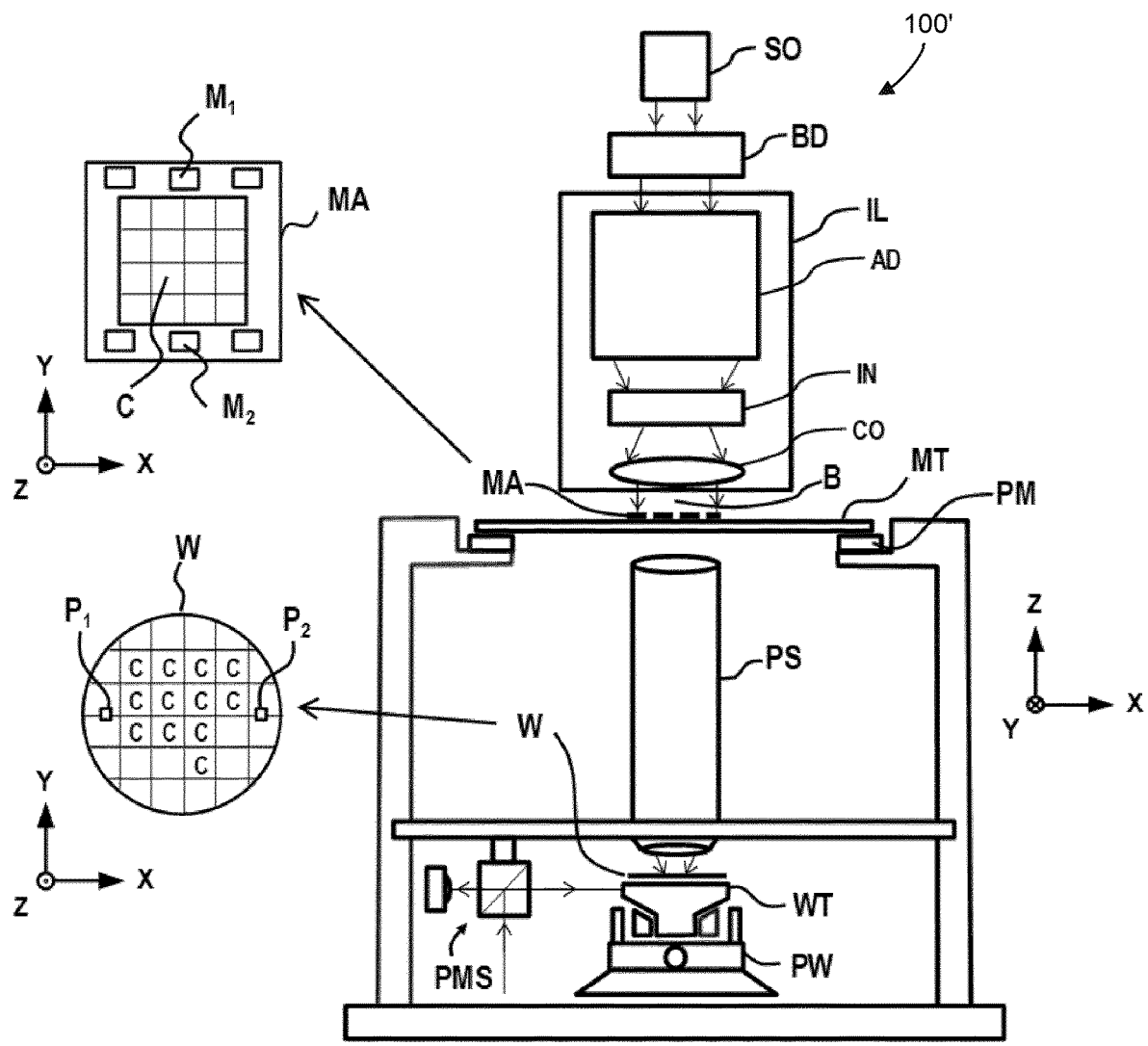
FIG. 1B is a schematic illustration of an example transmissive lithographic apparatus according to some aspects of the present disclosure.

FIGS. 1A and 1B are schematic illustrations of a lithographic apparatus 100 and a lithographic apparatus 100', respectively, in which aspects of the present disclosure can be implemented. As shown in FIGS. 1A and 1B, the lithographic apparatuses 100 and 100' are illustrated from a point of view (e.g., a side view) that is normal to the XZ plane (e.g., the X-axis points to the right, the Z-axis points upward, and the Y-axis points into the page away from the viewer), while the patterning device MA and the substrate W are presented from additional points of view (e.g., a top view) that are normal to the XY plane (e.g., the X-axis points to the right, the Y-axis points upward, and the Z-axis points out of the page toward the viewer).

In some aspects, the lithographic apparatus 100 and/or the lithographic apparatus 100' can include one or more of the following structures: an illumination system IL (e.g., an illuminator) configured to condition a radiation beam B (e.g., a deep ultra violet (DUV) radiation beam or an extreme ultra violet (EUV) radiation beam); a support structure MT (e.g., a mask table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table) configured to hold a substrate W (e.g., a resist-coated wafer) and connected to a second positioner PW configured to accurately position the substrate W. Lithographic apparatuses 100 and 100' also have a projection system PS (e.g., a refractive projection lens system) configured to project a pattern imparted to the radiation beam B by patterning device MA onto a target portion C (e.g., a portion including one or more dies) of the substrate W. In lithographic apparatus 100, the patterning device MA and the projection system PS are reflective. In lithographic apparatus 100', the patterning device MA and the projection system PS are transmissive.

In some aspects, in operation, the illumination system IL can receive a radiation beam from a radiation source SO (e.g., via a beam delivery system BD shown in FIG. 1B). The illumination system IL can include various types of optical structures, such as refractive, reflective, catadioptric, magnetic, electromagnetic, electrostatic, and other types of optical components, or any combination thereof, for directing, shaping, or controlling radiation. In some aspects, the illumination system IL can be configured to condition the radiation beam B to have a desired spatial and angular intensity distribution in its cross-section at a plane of the patterning device MA.

In some aspects, the support structure MT can hold the patterning device MA in a manner that depends on the orientation of the patterning device MA with respect to a reference frame, the design of at least one of the lithographic apparatuses 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

In some aspects, the patterning device MA can be transmissive (as in lithographic apparatus 100' of FIG. 1B) or reflective (as in lithographic apparatus 100 of FIG. 1A). The patterning device MA can include various structures such as reticles, masks, programmable mirror arrays, programmable LCD panels, other suitable structures, or combinations thereof. Masks can include mask types such as binary, alternating phase shift, or attenuated phase shift, as well as various hybrid mask types. In one example, a programmable mirror array can include a matrix arrangement of small mirrors, each of which can be individually tilted so as to reflect an incoming radiation beam in different directions. The tilted mirrors can impart a pattern in the radiation beam B, which is reflected by a matrix of small mirrors.

The term "projection system" PS should be interpreted broadly and can encompass any type of projection system, including refractive, reflective, catadioptric, magnetic, anamorphic, electromagnetic, and electrostatic optical systems, or any combination thereof, as appropriate for the exposure radiation being used, and/or for other factors such as the use of an immersion liquid (e.g., on the substrate W) or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps. In addition, any use herein of the term "projection lens" can be interpreted, in some aspects, as synonymous with the more general term "projection system" PS.

In some aspects, the lithographic apparatus 100 and/or the lithographic apparatus 100' can be of a type having two (e.g., "dual stage") or more substrate tables WT and/or two or more mask tables). In such "multiple stage" machines, the additional substrate tables WT can be used in parallel, or preparatory steps can be carried out on one or more tables while one or more other substrate tables WT are being used for exposure. In one example, steps in preparation of a subsequent exposure of the substrate W can be carried out on the substrate W located on one of the substrate tables WT while another substrate W located on another of the substrate tables WT is being used for exposing a pattern on another substrate W. In some aspects, the additional table may not be a substrate table WT.

In some aspects, in addition to the substrate table WT, the lithographic apparatus 100 and/or the lithographic apparatus 100' can include a measurement stage. The measurement stage can be arranged to hold a sensor. The sensor can be arranged to measure a property of the projection system PS, a property of the radiation beam B, or both. In some aspects, the measurement stage can hold multiple sensors. In some aspects, the measurement stage can move beneath the projection system PS when the substrate table WT is away from the projection system PS.

In some aspects, the lithographic apparatus 100 and/or the lithographic apparatus 100' can also be of a type wherein at least a portion of the substrate can be covered by a liquid having a relatively high refractive index, e.g., water, so as to fill a space between the projection system PS and the substrate W. An immersion liquid can also be applied to other spaces in the lithographic apparatus, for example, between the patterning device MA and the projection system PS. Immersion techniques provide for increasing the numerical aperture of projection systems. The term "immersion" as used herein does not mean that a structure, such as a substrate, must be submerged in liquid, but rather only means that liquid is located between the projection system and the substrate during exposure. Various immersion techniques are described in U.S. Pat. No. 6,952,253, issued Oct. 4, 2005, and titled "LITHOGRAPHIC APPARATUS AND DEVICE MANUFACTURING METHOD," which is incorporated by reference herein in its entirety.

Referring to FIGS. 1A and 1B, the illumination system IL receives a radiation beam B from a radiation source SO. The radiation source SO and the lithographic apparatus 100 or 100' can be separate physical entities, for example, when the radiation source SO is an excimer laser. In such cases, the radiation source SO is not considered to form part of the lithographic apparatus 100 or 100', and the radiation beam B passes from the radiation source SO to the illumination system IL with the aid of a beam delivery system BD (e.g., shown in FIG. 1B) including, for example, suitable directing mirrors and/or a beam expander. In other cases, the radiation source SO can be an integral part of the lithographic apparatus 100 or 100', for example, when the radiation source SO is a mercury lamp. The radiation source SO and the illuminator IL, together with the beam delivery system BD, if required, can be referred to as a radiation system.

In some aspects, the illumination system IL can include an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components, such as an integrator IN and a radiation collector CO (e.g., a condenser or collector optic). In some aspects, the illumination system IL can be used to condition the radiation beam B to have a desired uniformity and intensity distribution in its cross section.

Referring to FIG. 1A, in operation, the radiation beam B can be incident on the patterning device MA (e.g., a mask, reticle, programmable mirror array, programmable LCD panel, any other suitable structure or combination thereof), which can be held on the support structure MT (e.g., a mask table), and can be patterned by the pattern (e.g., design layout) present on the patterning device MA. In lithographic apparatus 100, the radiation beam B can be reflected from the patterning device MA. Having traversed (e.g., after being reflected from) the patterning device MA, the radiation beam B can pass through the projection system PS, which can focus the radiation beam B onto a target portion C of the substrate W or onto a sensor arranged at a stage.

In some aspects, with the aid of the second positioner PW and position sensor IFD2 (e.g., an interferometric device, linear encoder, or capacitive sensor), the substrate table WT can be moved accurately, e.g., so as to position different target portions C in the path of the radiation beam B. Similarly, the first positioner PM and another position sensor IFD1 (e.g., an interferometric device, linear encoder, or capacitive sensor) can be used to accurately position the patterning device MA with respect to the path of the radiation beam B.

In some aspects, patterning device MA and substrate W can be aligned using mask alignment marks M1 and M2 and substrate alignment marks P1 and P2. Although FIGS. 1A and 1B illustrate the substrate alignment marks P1 and P2 as occupying dedicated target portions, the substrate alignment marks P1 and P2 may be located in spaces between target portions. Substrate alignment marks P1 and P2 are known as scribe-lane alignment marks when they are located between the target portions C. Substrate alignment marks P1 and P2 can also be arranged in the target portion C area as in-die marks. These in-die marks can also be used as metrology marks, for example, for overlay measurements.

In some aspects, for purposes of illustration and not limitation, one or more of the figures herein can utilize a Cartesian coordinate system. The Cartesian coordinate system includes three axes: an X-axis; a Y-axis; and a Z-axis. Each of the three axes is orthogonal to the other two axes (e.g., the X-axis is orthogonal to the Y-axis and the Z-axis, the Y-axis is orthogonal to the X-axis and the Z-axis, the Z-axis is orthogonal to the X-axis and the Y-axis). A rotation around the X-axis is referred to as an Rx-rotation. A rotation around the Y-axis is referred to as an Ry-rotation. A rotation around about the Z-axis is referred to as an Rz-rotation. In some aspects, the X-axis and the Y-axis define a horizontal plane, whereas the Z-axis is in a vertical direction. In some aspects, the orientation of the Cartesian coordinate system may be different, for example, such that the Z-axis has a component along the horizontal plane. In some aspects, another coordinate system, such as a cylindrical coordinate system, can be used.

Referring to FIG. 1B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. In some aspects, the projection system PS can have a pupil conjugate to an illumination system pupil. In some aspects, portions of radiation can emanate from the intensity distribution at the illumination system pupil and traverse a mask pattern without being affected by diffraction at the mask pattern MP and create an image of the intensity distribution at the illumination system pupil.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Reflected light (e.g., zeroth-order diffracted beams) traverses the pattern without any change in propagation direction. The zeroth-order diffracted beams traverse an upper lens or upper lens group of the projection system PS, upstream of the pupil conjugate of the projection system PS, to reach the pupil conjugate. The portion of the intensity distribution in the plane of the pupil conjugate and associated with the zeroth-order diffracted beams is an image of the intensity distribution in the illumination system pupil of the illumination system IL. In some aspects, an aperture device can be disposed at, or substantially at, a plane that includes the pupil conjugate of the projection system PS.

The projection system PS is arranged to capture, by means of a lens or lens group, not only the zeroth-order diffracted beams, but also first-order or first- and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of an illumination system pupil. Further, in some aspects, astigmatism aberration can be reduced by blocking the zeroth-order beams in the pupil conjugate of the projection system PS associated with radiation poles in opposite quadrants. This is described in more detail in U.S. Pat. No. 7,511,799, issued Mar. 31, 2009, and titled "LITHOGRAPHIC PROJECTION APPARATUS AND A DEVICE MANUFACTURING METHOD," which is incorporated by reference herein in its entirety.

In some aspects, with the aid of the second positioner PW and a position measurement system PMS (e.g., including a position sensor such as an interferometric device, linear encoder, or capacitive sensor), the substrate table WT can be moved accurately, e.g., so as to position different target portions C in the path of the radiation beam B at a focused and aligned position. Similarly, the first positioner PM and another position sensor (e.g., an interferometric device, linear encoder, or capacitive sensor) (not shown in FIG. 1B) can be used to accurately position the patterning device MA with respect to the path of the radiation beam B (e.g., after mechanical retrieval from a mask library or during a scan). Patterning device MA and substrate W can be aligned using mask alignment marks M1 and M2 and substrate alignment marks P1 and P2.

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1 and M2, and substrate alignment marks P1 and P2. Although the substrate alignment marks (as illustrated) occupy dedicated target portions, they can be located in spaces between target portions (e.g., scribe-lane alignment marks). Similarly, in situations in which more than one die is provided on the patterning device MA, the mask alignment marks M1 and M2 can be located between the dies.

Support structure MT and patterning device MA can be in a vacuum chamber V, where an in-vacuum robot can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot. In some instances, both the in-vacuum and out-of-vacuum robots need to be calibrated for a smooth transfer of any payload (e.g., a mask) to a fixed kinematic mount of a transfer station.

In some aspects, the lithographic apparatuses 100 and 100' can be used in at least one of the following modes:

1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.

2. In scan mode, the support structure MT and the substrate table WT are scanned synchronously while a pattern imparted to the radiation beam B is projected onto a target portion C (e.g., a single dynamic exposure). The velocity and direction of the substrate table WT relative to the support structure MT (e.g., mask table) can be determined by the (de-)magnification and image reversal characteristics of the projection system PS.

3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

In some aspects, the lithographic apparatuses 100 and 100' can employ combinations and/or variations of the above-described modes of use or entirely different modes of use.

In some aspects, as shown in FIG. 1A, the lithographic apparatus 100 can include an EUV source configured to generate an EUV radiation beam B for EUV lithography. In general, the EUV source can be configured in a radiation source SO, and a corresponding illumination system IL can be configured to condition the EUV radiation beam B of the EUV source.

Figure 2:
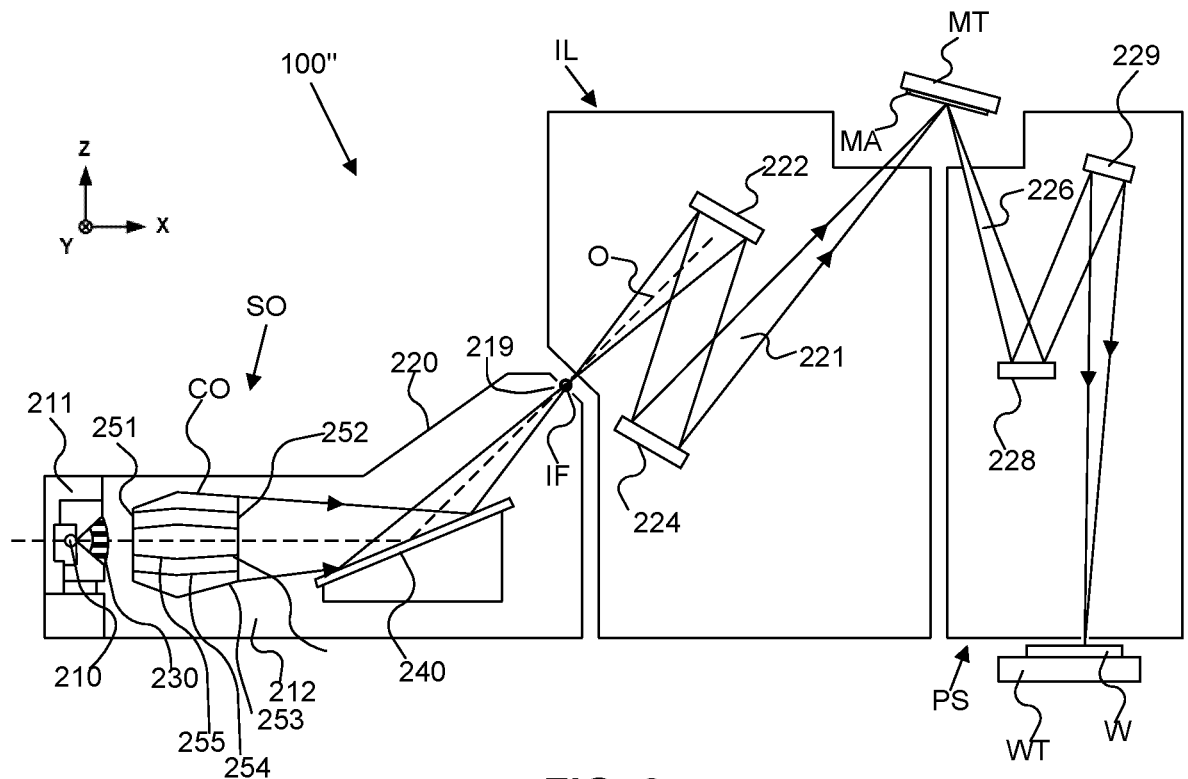
FIG. 2 is a more detailed schematic illustration of the reflective lithographic apparatus shown in FIG. 1A according to some aspects of the present disclosure.

FIG. 2 shows the lithographic apparatus 100 in more detail, including the radiation source SO (e.g., a source collector apparatus), the illumination system IL, and the projection system PS. As shown in FIG. 2, the lithographic apparatus 100 is illustrated from a point of view (e.g., a side view) that is normal to the XZ plane (e.g., the X-axis points to the right and the Z-axis points upward).

The radiation source SO is constructed and arranged such that a vacuum environment can be maintained in an enclosing structure 220. The radiation source SO includes a source chamber 211 and a collector chamber 212 and is configured to produce and transmit EUV radiation. EUV radiation can be produced by a gas or vapor, for example xenon (Xe) gas, lithium (Li) vapor, or tin (Sn) vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, about 10.0 pascals (Pa) of Xe gas, Li vapor, Sn vapor, or any other suitable gas or vapor can be used for efficient generation of the radiation. In some aspects, a plasma of excited tin is provided to produce EUV radiation.

The radiation emitted by the EUV radiation emitting plasma 210 is passed from the source chamber 211 into the collector chamber 212 via an optional gas barrier or contaminant trap 230 (e.g., in some cases also referred to as contaminant barrier or foil trap), which is positioned in or behind an opening in the source chamber 211. The contaminant trap 230 can include a channel structure. Contaminant trap 230 can also include a gas barrier or a combination of a gas barrier and a channel structure. The contaminant trap 230 further indicated herein at least includes a channel structure.

The collector chamber 212 can include a radiation collector CO (e.g., a condenser or collector optic), which can be a so-called grazing incidence collector. Radiation collector CO has an upstream radiation collector side 251 and a downstream radiation collector side 252. Radiation that traverses radiation collector CO can be reflected off a grating spectral filter 240 to be focused in a virtual source point IF. The virtual source point IF is commonly referred to as the intermediate focus, and the source collector apparatus is arranged such that the virtual source point IF is located at or near an opening 219 in the enclosing structure 220. The virtual source point IF is an image of the EUV radiation emitting plasma 210. The grating spectral filter 240 can be used to suppress infrared (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination system IL and projection system PS. Optionally, the grating spectral filter 240 can be present depending upon the type of lithographic apparatus. Further, there can be more mirrors present than those shown in the FIG. 2. For example, there can be one to six additional reflective elements present in the projection system PS than shown in FIG. 2.

Radiation collector CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a radiation collector CO of this type is preferably used in combination with a discharge produced plasma (DPP) source.

Example Lithographic Cell

Figure 3:
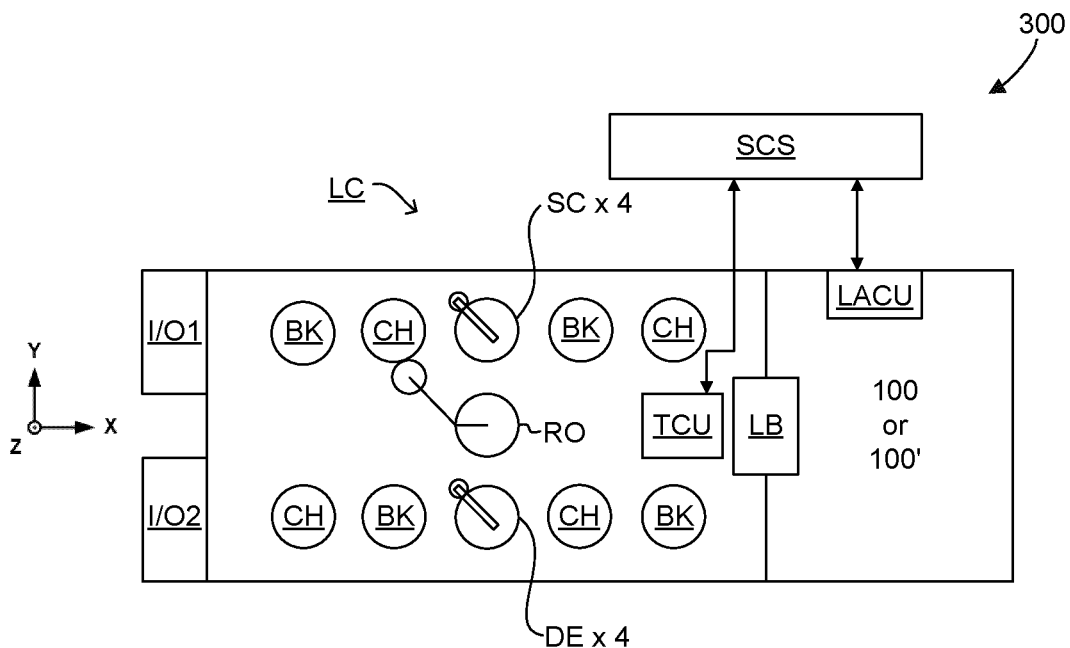
FIG. 3 is a schematic illustration of an example lithographic cell according to some aspects of the present disclosure.

FIG. 3 shows a lithographic cell 300, also sometimes referred to a lithocell or cluster. As shown in FIG. 3, the lithographic cell 300 is illustrated from a point of view (e.g., a top view) that is normal to the XY plane (e.g., the X-axis points to the right and the Y-axis points upward).

Lithographic apparatus 100 or 100' can form part of lithographic cell 300. Lithographic cell 300 can also include one or more apparatuses to perform pre- and post-exposure processes on a substrate. For example, these apparatuses can include spin coaters SC to deposit resist layers, developers DE to develop exposed resist, chill plates CH, and bake plates BK. A substrate handler RO (e.g., a robot) picks up substrates from input/output ports I/O1 and I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Radiation Source

Figure 4:
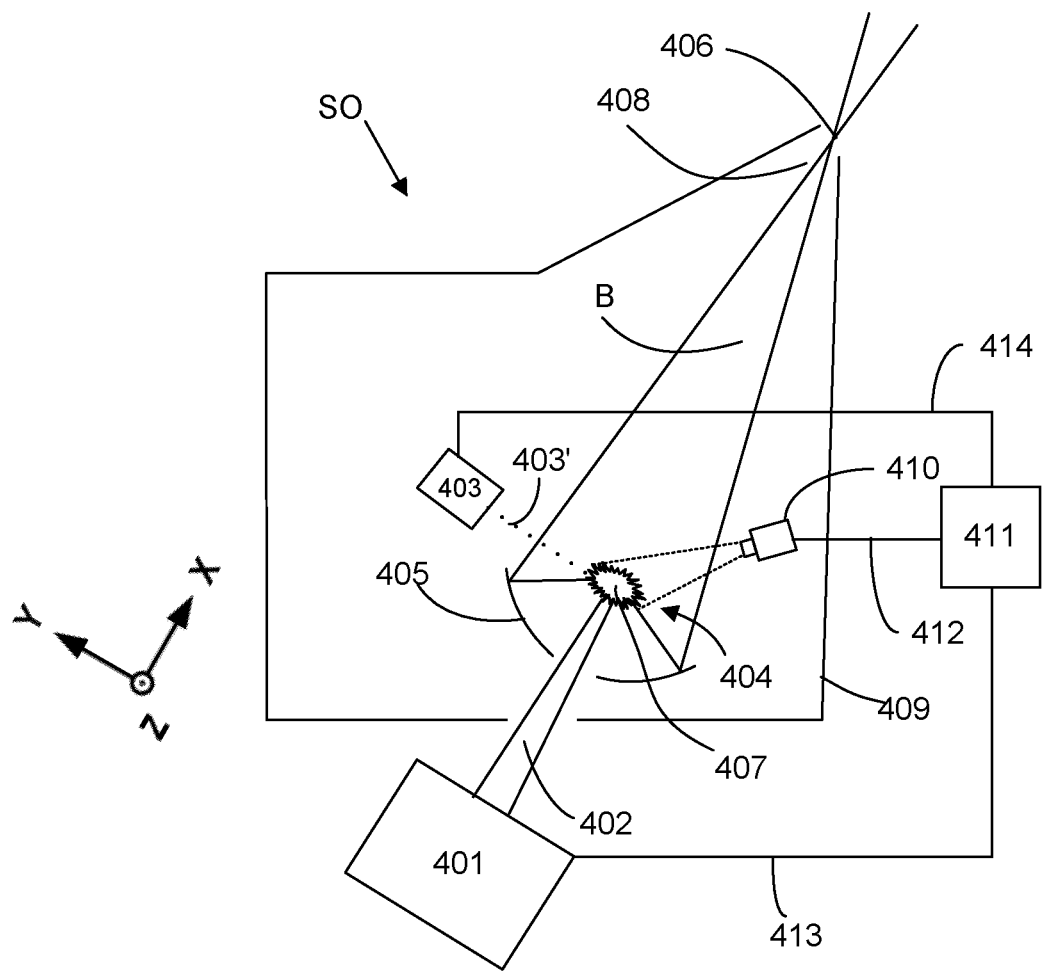
FIG. 4 is a schematic illustration of an example radiation source for an example reflective lithographic apparatus according to some aspects of the present disclosure.

An example of the radiation source SO for an example reflective lithographic apparatus (e.g., lithographic apparatus 100 of FIG. 1A) is shown in FIG. 4. As shown in FIG. 4, the radiation source SO is illustrated from a point of view (e.g., a top view) that is normal to the XY plane as described below.

The radiation source SO shown in FIG. 4 is of a type which can be referred to as a laser produced plasma (LPP) source. A laser system 401, which can for example include a carbon dioxide ($CO_2$) laser, is arranged to deposit energy via one or more laser beams 402 into fuel targets 403', such as one or more discrete tin (Sn) droplets, which are provided from a fuel target generator 403 (e.g., example, fuel emitter, droplet generator). According to some aspects, laser system 401 can be, or can operate in the fashion of, a pulsed, continuous wave or quasi-continuous wave laser. The trajectory of fuel targets 403' (e.g., example, droplets) emitted from the fuel target generator 403 can be parallel to an X-axis. According to some aspects, the one or more laser beams 402 propagate in a direction parallel to a Y-axis, which is perpendicular to the X-axis. A Z-axis is perpendicular to both the X-axis and the Y-axis and extends generally into (or out of) the plane of the page, but in other aspects, other configurations are used. In some embodiments, the laser beams 402 can propagate in a direction other than parallel to the Y-axis (e.g., in a direction other than orthogonal to the X-axis direction of the trajectory of the fuel targets 403').

In some aspects, the one or more laser beams 402 can include a pre-pulse laser beam and a main pulse laser beam. In such aspects, the laser system 401 can be configured to hit each of the fuel targets 403' with a pre-pulse laser beam to generate a modified fuel target. The laser system 401 can be further configured to hit each of the modified fuel targets with a main pulse laser beam to generate the plasma 407.

Although tin is referred to in the following description, any suitable target material can be used. The target material can for example be in liquid form, and can for example be a metal or alloy. Fuel target generator 403 can include a nozzle configured to direct tin, e.g., in the form of fuel targets 403' (e.g., discrete droplets) along a trajectory towards a plasma formation region 404. Throughout the remainder of the description, references to "fuel", "fuel target" or "fuel droplet" are to be understood as referring to the target material (e.g., droplets) emitted by fuel target generator 403. Fuel target generator 403 can include a fuel emitter. The one or more laser beams 402 are incident upon the target material (e.g., tin) at the plasma formation region 404. The deposition of laser energy into the target material creates a plasma 407 at the plasma formation region 404. Radiation, including EUV radiation, is emitted from the plasma 407 during de-excitation and recombination of ions and electrons of the plasma.

The EUV radiation is collected and focused by a radiation collector 405 (e.g., radiation collector CO). In some aspects, radiation collector 405 can include a near normal-incidence radiation collector (sometimes referred to more generally as a normal-incidence radiation collector). The radiation collector 405 can be a multilayer structure, which is arranged to reflect EUV radiation (e.g., EUV radiation having a desired wavelength such as about 13.5 nm). According to some aspects, radiation collector 405 can have an ellipsoidal configuration, having two focal points. A first focal point can be at the plasma formation region 404, and a second focal point can be at an intermediate focus 406, as discussed herein.

In some aspects, laser system 401 can be located at a relatively long distance from the radiation source SO. Where this is the case, the one or more laser beams 402 can be passed from laser system 401 to the radiation source SO with the aid of a beam delivery system (not shown) including, for example, suitable directing mirrors and/or a beam expander, and/or other optics. Laser system 401 and the radiation source SO can together be considered to be a radiation system.

Radiation that is reflected by radiation collector 405 forms a radiation beam B. The radiation beam B is focused at a point (e.g., the intermediate focus 406) to form an image of plasma formation region 404, which acts as a virtual radiation source for the illumination system IL. The point at which the radiation beam B is focused can be referred to as the intermediate focus (IF) (e.g., intermediate focus 406). The radiation source SO is arranged such that the intermediate focus 406 is located at or near to an opening 408 in an enclosing structure 409 of the radiation source SO.

The radiation beam B passes from the radiation source SO into the illumination system IL, which is configured to condition the radiation beam B. The radiation beam B passes from the illumination system IL and is incident upon the patterning device MA held by the support structure MT. The patterning device MA reflects and patterns the radiation beam B. Following reflection from the patterning device MA the patterned radiation beam B enters the projection system PS. The projection system includes a plurality of mirrors, which are configured to project the radiation beam B onto a substrate W held by the substrate table WT. The projection system PS can apply a reduction factor to the radiation beam, forming an image with features that are smaller than corresponding features on the patterning device MA. For example, a reduction factor of four can be applied. Although the projection system PS is shown as having two mirrors in FIG. 2, the projection system can include any number of mirrors (e.g., six mirrors).

The radiation source SO can also include components which are not illustrated in FIG. 4. For example, a spectral filter can be provided in the radiation source SO. The spectral filter can be substantially transmissive for EUV radiation but substantially blocking for other wavelengths of radiation such as infrared radiation.

The radiation source SO (or radiation system) can further include a fuel target imaging system to obtain images of fuel targets (e.g., droplets) in the plasma formation region 404 or, more particularly, to obtain images of shadows of the fuel targets. The fuel target imaging system can detect light diffracted from the edges of the fuel targets. References to images of the fuel targets in the following text should be understood also to refer to images of shadows of the fuel targets or diffraction patterns caused by the fuel targets.

The fuel target imaging system can include a photodetector such as a CCD array or a CMOS sensor, but it will be appreciated that any imaging device suitable for obtaining images of the fuel targets can be used. It will be appreciated that the fuel target imaging system can include optical components, such as one or more lenses, in addition to a photodetector. For example, the fuel target imaging system can include a camera 410, e.g., a combination of a photosensor or photodetector and one or more lenses. The optical components can be selected so that the photosensor or camera 410 obtains near-field images and/or far-field images. The camera 410 can be positioned within the radiation source SO at any appropriate location from which the camera has a line of sight to the plasma formation region 404 and one or more markers (not shown in FIG. 4) provided on the radiation collector 405. In some aspects, however, it can be necessary to position the camera 410 away from the propagation path of the one or more laser beams 402 and from the trajectory of the fuel targets emitted from fuel target generator 403 so as to avoid damage to the camera 410. According to some aspects, the camera 410 is configured to provide images of the fuel targets to a controller 411 via a connection 412. The connection 412 is shown as a wired connection, though it will be appreciated that the connection 412 (and other connections referred to herein) can be implemented as either a wired connection or a wireless connection or a combination thereof.

As shown in FIG. 4, the radiation source SO can include a fuel target generator 403 configured to generate and emit fuel targets 403' (e.g., discrete tin droplets) towards a plasma formation region 404. The radiation source SO can further include a laser system 401 configured to hit one or more of the fuel targets 403' with one or more laser beams 402 for generating a plasma 407 at the plasma formation region 404. The radiation source SO can further include a radiation collector 405 (e.g., a radiation collector CO) configured to collect radiation emitted by the plasma 407.

Example Illumination Uniformity Correction System

Figure 5A:
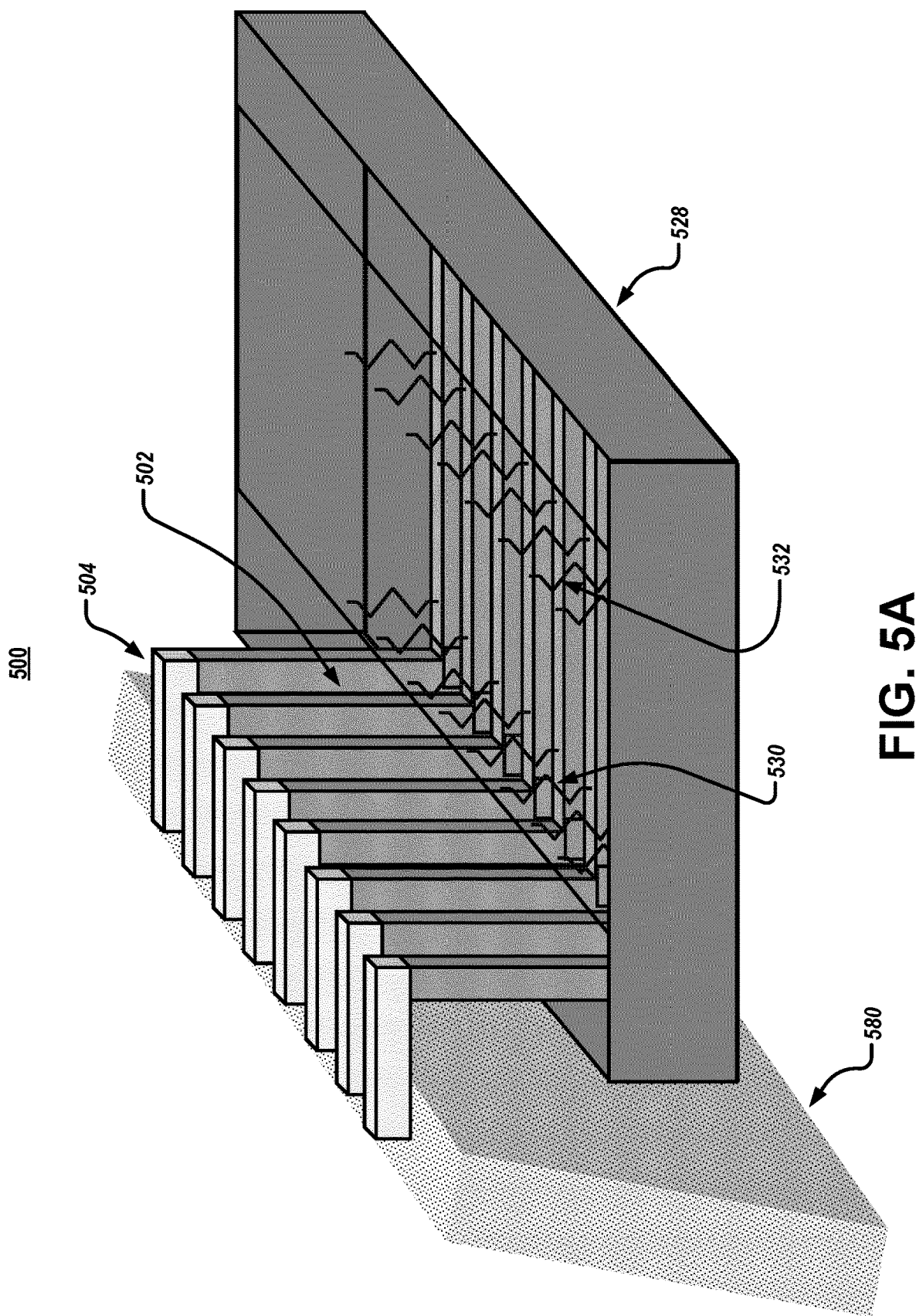
FIGS. 5A and 5B are schematic illustrations of an example illumination uniformity correction system according to some aspects of the present disclosure.
Figure 5B:
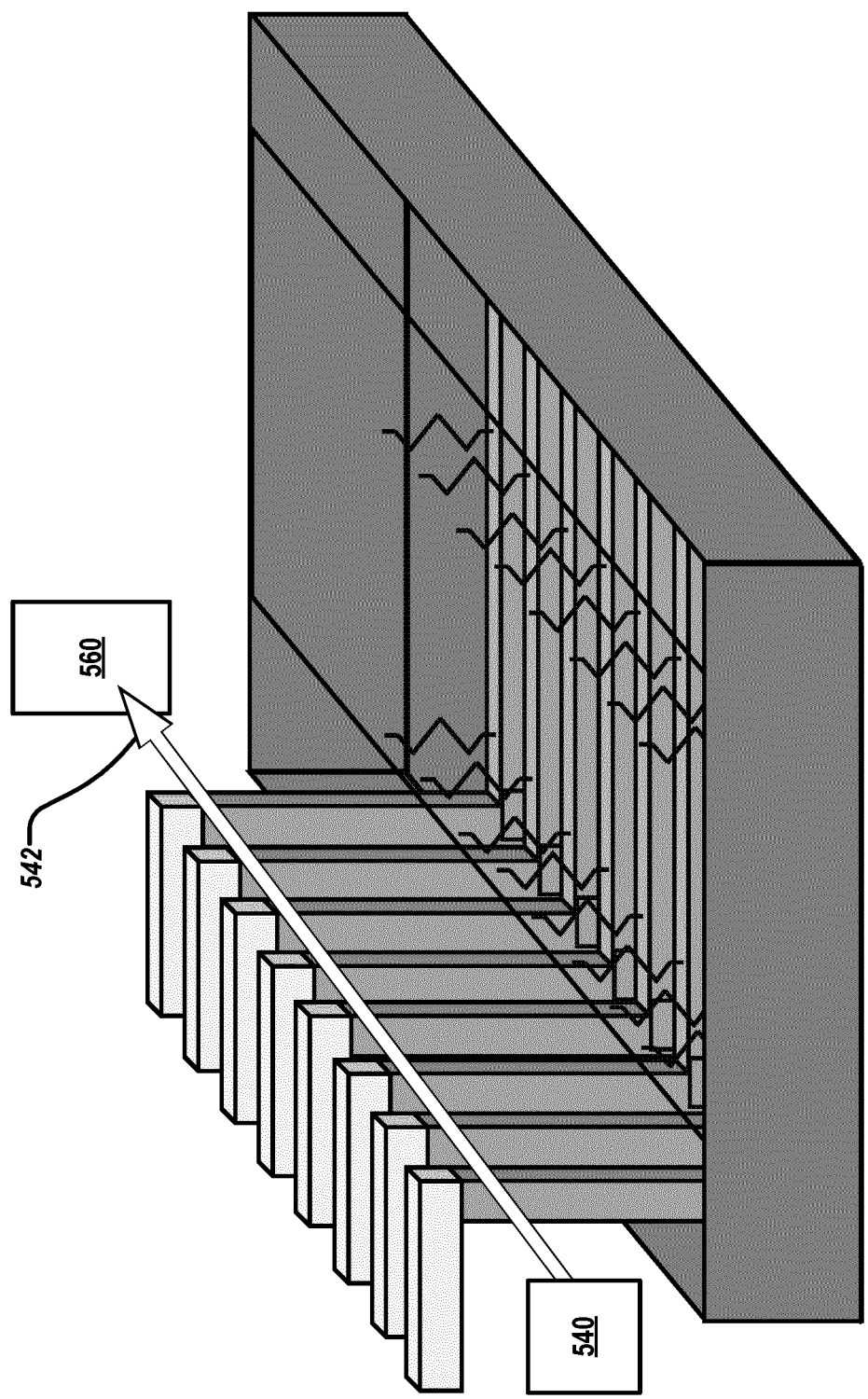

FIGS. 5A and 5B are schematic illustrations of an example illumination uniformity correction system 500 according to some aspects of the present disclosure.

As shown in FIG. 5A, example illumination uniformity correction system 500 can include a set of finger assemblies 502 (e.g., 28 finger assemblies at a pitch of about ×4 mm), a set of fingertips 504 (e.g., each finger assembly includes a respective fingertip), a frame 528, a set of flexures 530, and a set of flexures 532. In some aspects, example illumination uniformity correction system 500 can individually control (e.g., using a motion control system that includes, but is not limited to, one or more magnet assemblies) the position of each finger assembly in the set of finger assemblies 502 to modify the intensity of the illumination slit in order to achieve a target uniformity.

As shown in FIG. 5B, example illumination uniformity correction system 500 can include a radiation source 540 and a radiation detector 560. In some aspects, radiation source 540 can be configured to generate radiation 542 and transmit radiation 542 across the set of finger assemblies 502 towards radiation detector 560. In some aspects, radiation 542 can include a laser curtain. In some aspects, example illumination uniformity correction system 500 can be configured to move one or more finger assemblies in the set of finger assemblies 502 into the laser curtain during a wafer exchange operation (e.g., between wafer exposure operations) to check for fingertip thermal growth. In some aspects, radiation detector 560 can be configured to receive at least a portion of radiation 542. In some aspects, the received portion of radiation 542 can include radiation reflected from a surface (e.g., a mechanical edge disposed opposite an optical edge) of a fingertip of a finger assembly in response to an irradiation of the surface of the fingertip by the transmitted radiation 542.

In some aspects, the optical edges of one or more fingertips in the set of fingertips 504 can be exposed to radiation 580 (e.g., DUV or EUV radiation) during a wafer exposure operation of a lithographic apparatus, which may cause the one or more fingertips to grow as a result of the exposure (or over the course of multiple exposures). In some aspects, example illumination uniformity correction system 500 can further include a processor (not shown) configured to determine a change in a shape of one or more finger assemblies in the set of finger assemblies 502 based on the received radiation 542.

Figure 6:
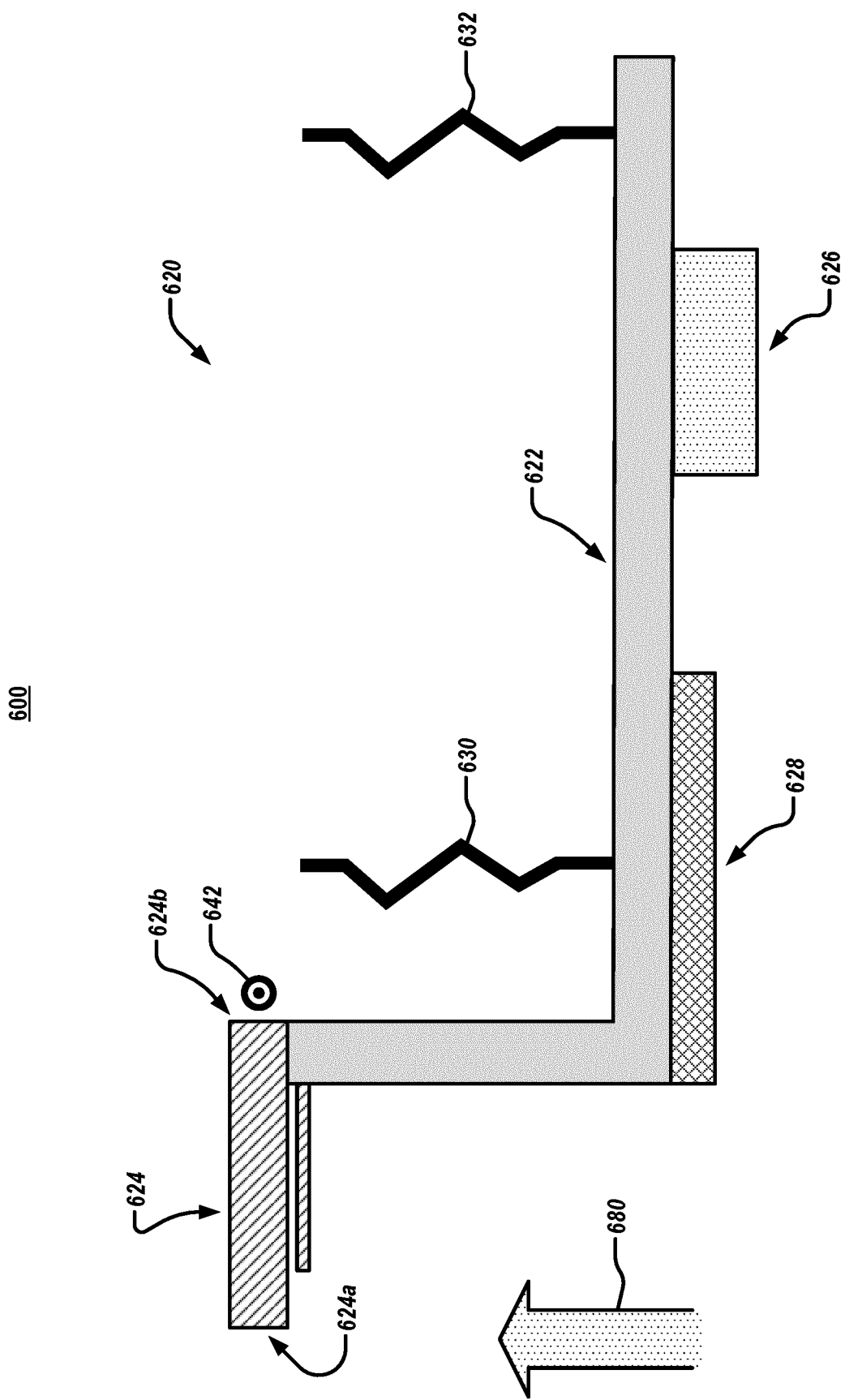
FIG. 6 is a schematic illustration of an example illumination uniformity correction system according to some aspects of the present disclosure.

FIG. 6 is a schematic illustration of an example illumination uniformity correction system 600 according to some aspects of the present disclosure.

As shown in FIG. 6, a set of finger assemblies can include a finger assembly 620. Finger assembly 620 can include a finger body 622, a fingertip 624, an actuator 626 (e.g., to adjust the position of finger assembly 620), a position sensor 628 (e.g., including but not limited to an encoder scale), a flexure 630, and a flexure 632. Fingertip 624 can include an optical edge 624a and a mechanical edge 624b. In some aspects, optical edge 624a of fingertip 624 can be exposed to radiation 680 (e.g., DUV or EUV radiation) during a wafer exposure operation of a lithographic apparatus, which may cause fingertip 624 to grow as a result of the exposure (or over the course of multiple exposures).

In some aspects, a radiation source can be configured to transmit radiation 642 towards finger assembly 620 (e.g., towards mechanical edge 624b of fingertip 624). In some aspects, the radiation source can be configured to transmit radiation 642 during a wafer exchange operation (e.g., following a wafer exposure operation) of a lithographic apparatus, during which mechanical edge 624b of fingertip 624 moves across radiation 642.

In some aspects, a radiation detector can be configured to receive at least a portion of radiation 642 in response to an irradiation of a portion of finger assembly 620 by radiation 642. In some aspects, the portion of finger assembly 620 can include mechanical edge 624b of fingertip 624 of finger assembly 620 disposed separate from optical edge 624a of fingertip 624 of finger assembly 620.

In some aspects, example illumination uniformity correction system 600 can further include a processor (not shown) configured to determine a change in a shape of one or more finger assemblies in a set of finger assemblies based on the received radiation 642. For example, the processor can be configured to determine a change in a position of optical edge 624a of fingertip 624 of finger assembly 620 based on a growth of fingertip 624 in response to an exposure of fingertip 624 to radiation 680.

In some aspects, the processor can be further configured to measure a change in a position of a reference mark disposed on finger assembly 620 based on the received radiation. In some aspects, the processor can be further configured to determine the change in the shape of finger assembly 620 based on the measured change in the position of the reference mark.

In some aspects, the processor can be further configured to generate a control signal configured to modify a position of one or more finger assemblies in the set of finger assemblies based on the determined change in the shape of one or more finger assemblies in the set of finger assemblies. For example, the processor can be configured to generate a control signal configured to modify a position of finger assembly 620 based on the determined change in the shape of finger assembly 620.

The processor can be further configured to transmit the control signal to a motion control system (e.g., including, but not limited to, one or more magnet assemblies) coupled to the one or more finger assemblies in the set of finger assemblies. For example, the processor can be configured to transmit the control signal to a motion control system including, but not limited to, actuator 626 coupled to finger body 622.

Figure 7:
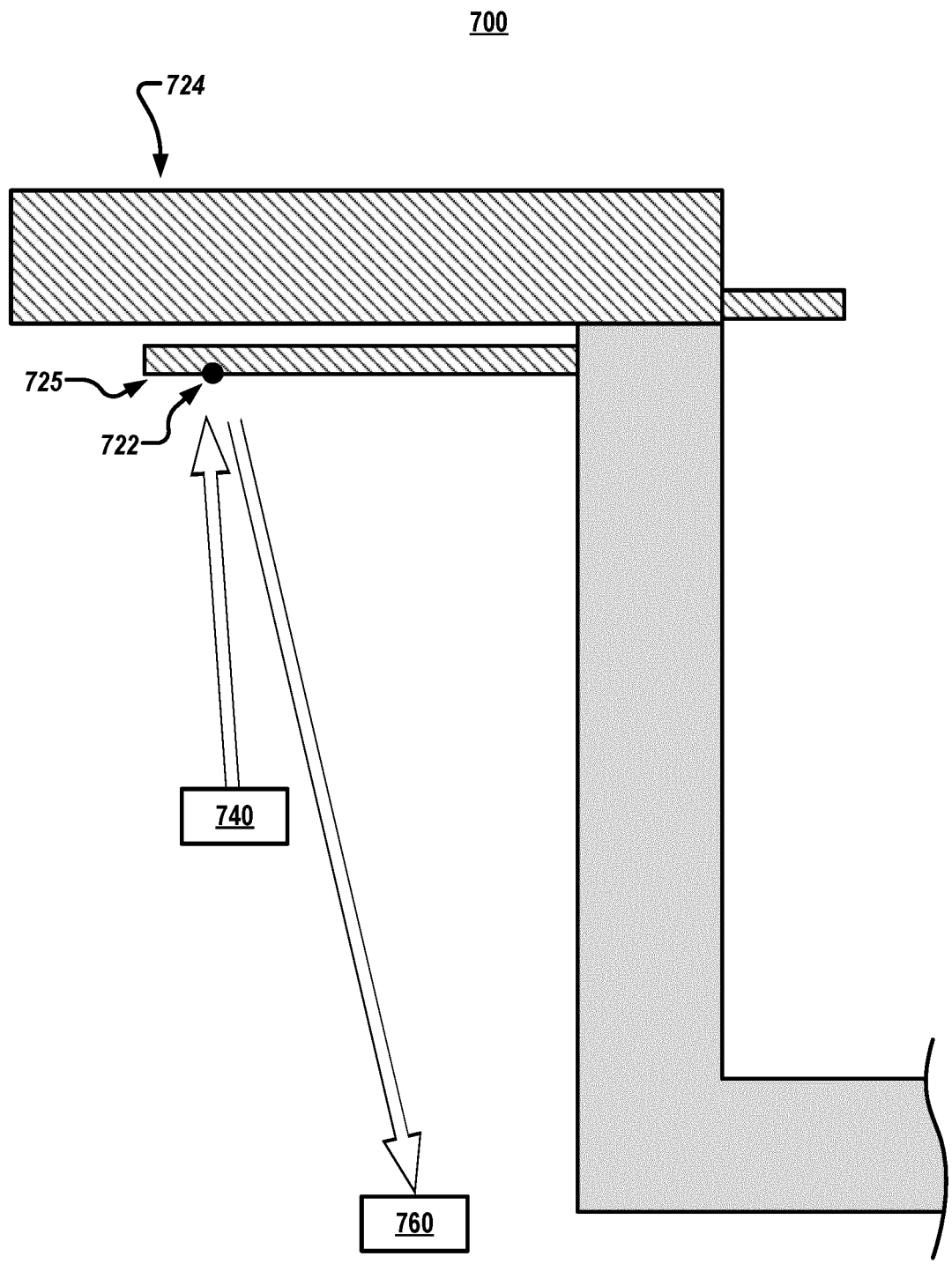
FIG. 7 is a schematic illustration of another example illumination uniformity correction system according to some aspects of the present disclosure.

FIG. 7 is a schematic illustration of an example illumination uniformity correction system 700 according to some aspects of the present disclosure.

As shown in FIG. 7, example illumination uniformity correction system 700 can include a finger assembly having a fingertip 724, a radiation source 740, and a radiation detector 760 per finger assembly (e.g., 28 radiation detectors for 28 finger assemblies). In some aspects, radiation source 740 can be configured to generate radiation and transmit the generated radiation towards a set of reference marks 722 (e.g., one or more reference marks) disposed on a surface 725 of the finger assembly (e.g., on the optical side of the finger assembly). In some aspects, radiation source 740 can be configured to transmit the radiation during a wafer exchange operation (e.g., following a wafer exposure operation) of a lithographic apparatus. In some aspects, radiation detector 760 can be configured to receive at least a portion of radiation reflected from surface 725.

In some aspects, example illumination uniformity correction system 700 can further include a processor (not shown) configured to determine a change in a shape of the finger assembly based on the received radiation. For example, the processor can be configured to determine a change in a position of the optical edge of fingertip 724 of the finger assembly based on a growth of fingertip 724 in response to an exposure of fingertip 724 to EUV or DUV radiation.

In some aspects, the processor can be further configured to measure a change in a position of the set of reference marks 722 disposed on surface 725 of the finger assembly based on the received radiation. In some aspects, the processor can be further configured to determine the change in the shape of the finger assembly based on the measured change in the position of the set of reference marks 722.

In some aspects, the processor can be further configured to generate a control signal configured to modify a position of the finger assembly based on the determined change in the shape of the finger assembly. In some aspects, the processor can be further configured to transmit the control signal to a motion control system (e.g., including, but not limited to, an actuator such as a magnet assembly) coupled to the finger assembly.

Figure 8:
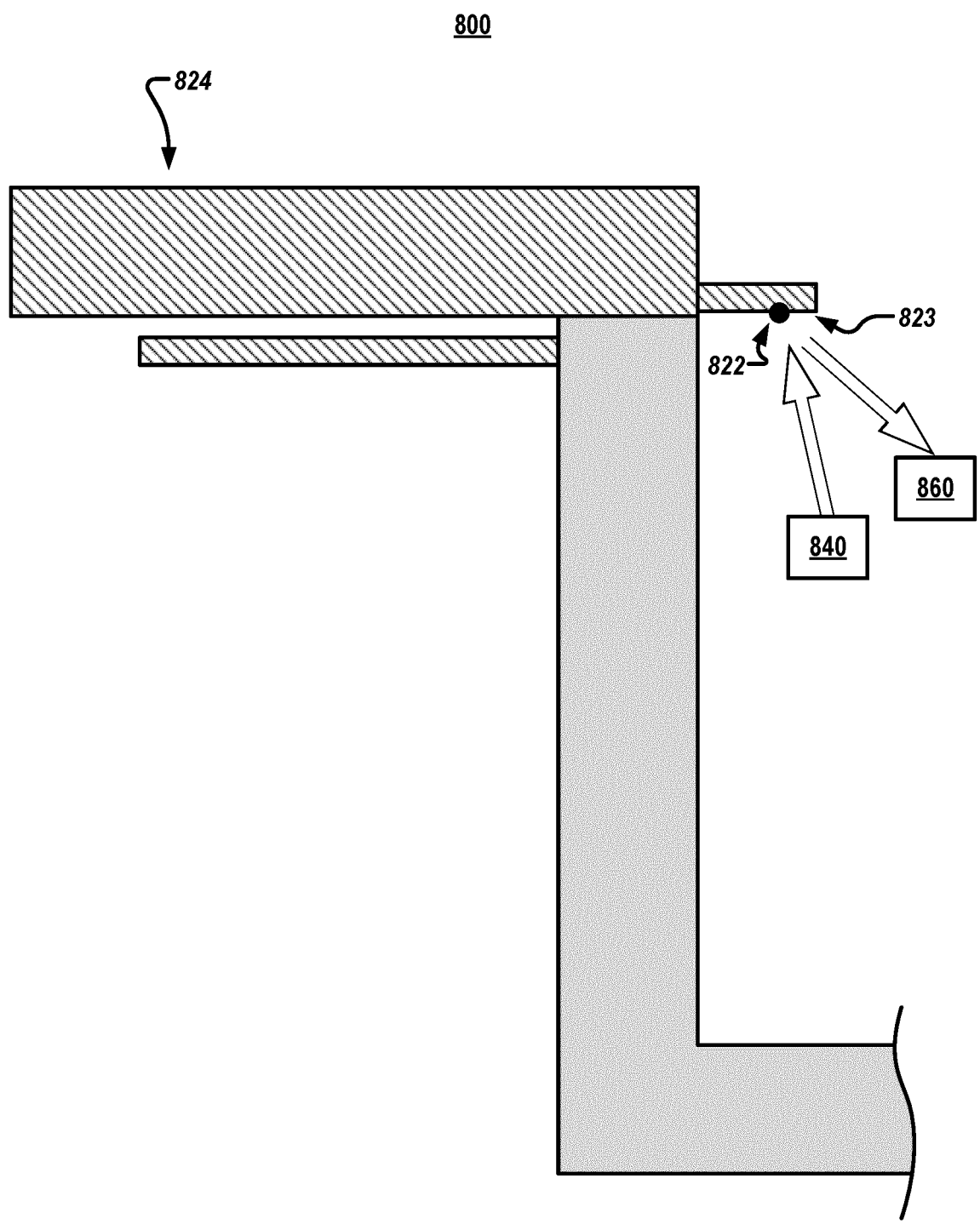
FIG. 8 is a schematic illustration of another example illumination uniformity correction system according to some aspects of the present disclosure.

FIG. 8 is a schematic illustration of an example illumination uniformity correction system 800 according to some aspects of the present disclosure.

As shown in FIG. 8, example illumination uniformity correction system 800 can include a finger assembly having a fingertip 824, a radiation source 840, and a radiation detector 860 per finger assembly (e.g., 28 radiation detectors for 28 finger assemblies). In some aspects, radiation source 840 can be configured to generate radiation and transmit the generated radiation towards a set of reference marks 822 (e.g., one or more reference marks) disposed on a surface 823 of the finger assembly (e.g., on the mechanical (non-optical) side of the finger assembly). In some aspects, radiation source 840 can be configured to transmit the radiation during a wafer exchange operation (e.g., following a wafer exposure operation) of a lithographic apparatus. In some aspects, radiation detector 860 can be configured to receive at least a portion of radiation reflected from surface 823.

In some aspects, example illumination uniformity correction system 800 can further include a processor (not shown) configured to determine a change in a shape of the finger assembly based on the received radiation. For example, the processor can be configured to determine a change in a position of the optical edge of fingertip 824 of the finger assembly based on a growth of fingertip 824 in response to an exposure of fingertip 824 to EUV or DUV radiation.

In some aspects, the processor can be further configured to measure a change in a position of the set of reference marks 822 disposed on surface 823 of the finger assembly based on the received radiation. In some aspects, the processor can be further configured to determine the change in the shape of the finger assembly based on the measured change in the position of the set of reference marks 822.

In some aspects, the processor can be further configured to generate a control signal configured to modify a position of the finger assembly based on the determined change in the shape of the finger assembly. In some aspects, the processor can be further configured to transmit the control signal to a motion control system (e.g., including, but not limited to, an actuator) coupled to the finger assembly.

Figure 9:
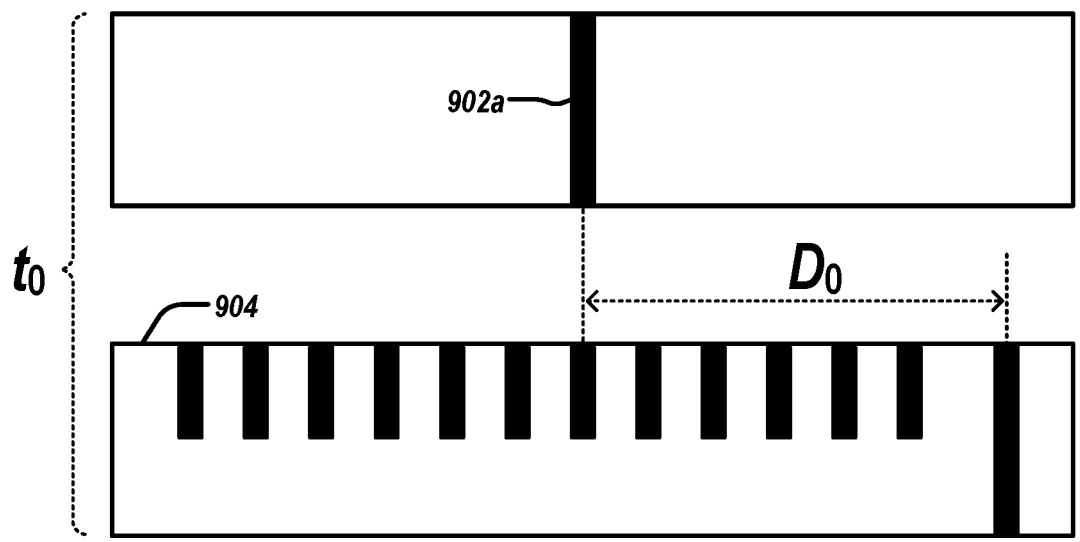
FIG. 9 is a schematic illustration of an example set of reference marks according to some aspects of the present disclosure.
Figure 9:
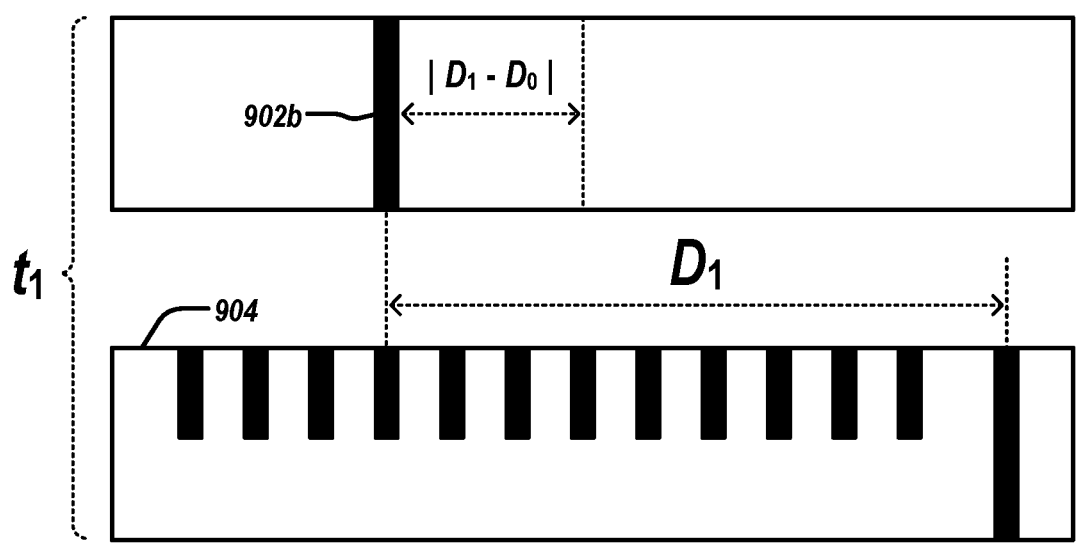

FIG. 9 is a schematic illustration of an example set of reference marks 900 according to some aspects of the present disclosure.

As shown in FIG. 9, example set of reference marks 900 can include a reference mark 902 (e.g., referred to as 902a at time to and 902b at time $t_1$) disposed on a surface of a finger assembly. In some aspects, reference mark 902 can be referred to as a fingertip reference. Example set of reference marks 900 can further include index marks 904 disposed on a surface of a finger assembly, such as, but not limited to, a surface of a position sensor (e.g., an encoder) disposed on, or attached to, the finger assembly. In one illustrative and non-limiting example, index marks 904 can be referred to as an "encoder index."

In some aspects, time to can correspond to a time associated with a calibration process performed during the manufacturing of an example illumination uniformity correction system, and reference mark 902a can correspond to a reference position on a fingertip measured at time to, where the value Do corresponds to the distance from reference mark 902a to index marks 904.

In some aspects, time $t_1$ can correspond to a time associated with a measurement performed during operation (e.g., a wafer exchange operation, a wafer exposure operation), and reference mark 902b can correspond to the reference position on the fingertip measured at time $t_1$, where the value $D_1$ corresponds to the distance from reference mark 902b to index marks 904. In some aspects, the value $D_1$ can be greater than the value $D_0$ due to fingertip growth during operation of the lithographic apparatus. In some aspects, a change in the position of reference mark 902 from time $t_0$ to time $t_1$ can be determined based on the difference between the value $D_0$ and the value $D_1$. For example, the change in the position of reference mark 902a at time $t_0$ to reference mark 902b at time $t_1$ can be proportional to the difference between the value Do and the value $D_1$.

Figure 10:
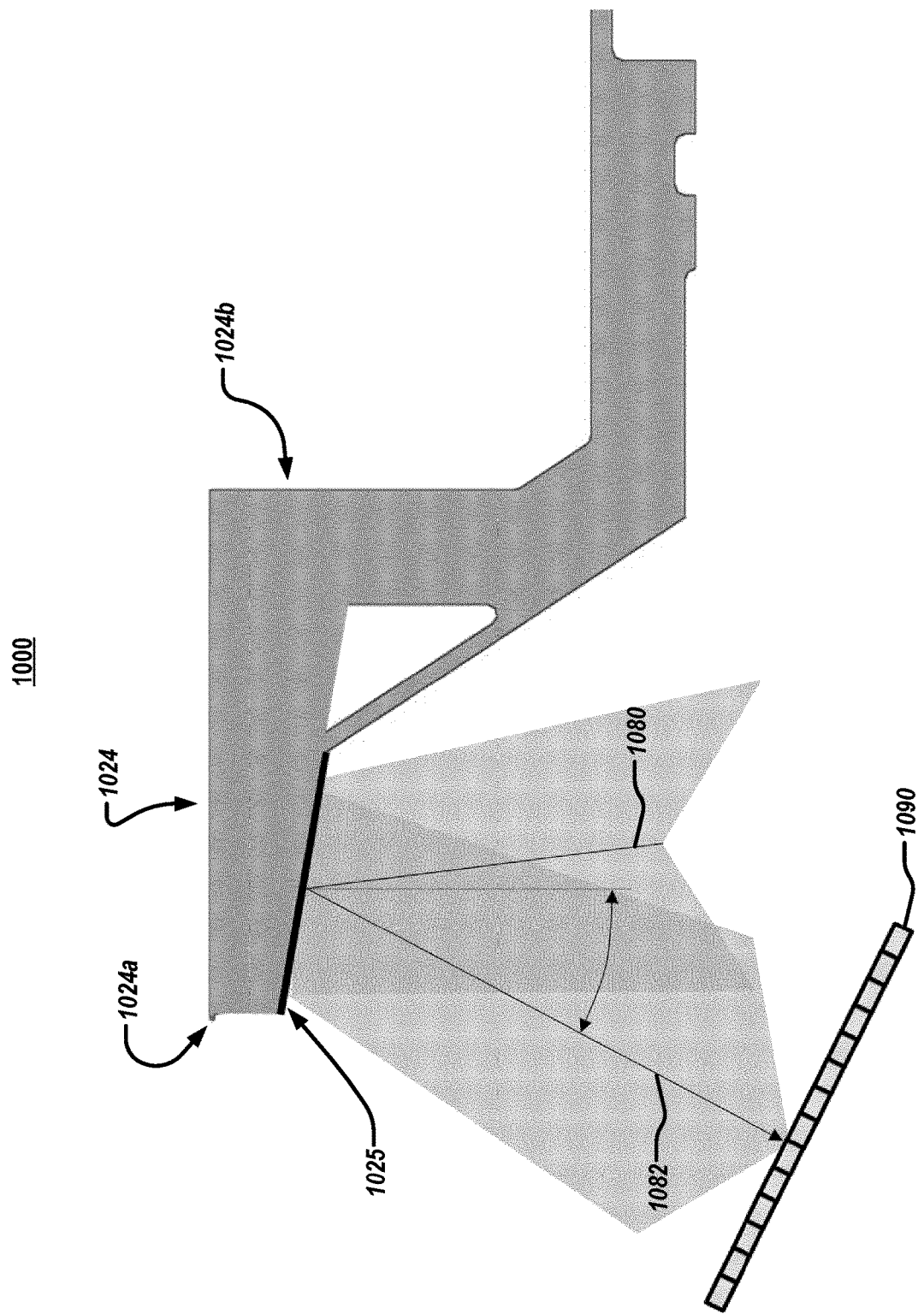
FIG. 10 is a schematic illustration of another example illumination uniformity correction system according to some aspects of the present disclosure.

FIG. 10 is a schematic illustration of an example illumination uniformity correction system 1000 according to some aspects of the present disclosure.

As shown in FIG. 10, example illumination uniformity correction system 1000 can include a finger assembly having a fingertip 1024. In some aspects, fingertip 1024 can include an optical edge 1024a and a mechanical edge 1024b. In some aspects, optical edge 1024a of fingertip 1024 can be exposed to incident radiation 1080 (e.g., DUV or EUV radiation, such as an actinic EUV light) during a wafer exposure operation of a lithographic apparatus, which may cause fingertip 1024 to grow as a result of the exposure (or over the course of multiple exposures).

In some aspects, fingertip 1024 can further include a multi-layer mirror material disposed on a surface 1025 of fingertip 1024. In some aspects, the multi-layer mirror material can include alternating layers of molybdenum and silicon. In some aspects, maximum steady-state fingertip temperatures can be reduced to allow the multi-layer mirror material to remain substantially stable. In some aspects, the multi-layer mirror material can reflect a substantial portion of incident radiation to reduce thermal impact while improving drift compensating capability and reducing the risk of non-survivable loss of fingertip attachment as radiation source power increases. In some aspects, fingertip 1024 can be an angled fingertip, and the multi-layer mirror material disposed on surface 1025 can reflect greater than 60 percent of incident radiation 1080 towards radiation detector 1090 (e.g., as reflected radiation 1082). As a result, the thermal load on fingertip 1024 can be reduced, and the reliability, lifetime, and performance of example illumination uniformity correction system 1000 can be increased.

In some aspects, example illumination uniformity correction system 1000 can further include a radiation detector 1090 (e.g., a one-dimensional or two-dimensional sensor array, a "beam+fingertip movement sensor"). In some aspects, example illumination uniformity correction system 1000 can include one radiation detector per finger assembly. In some aspects, the multi-layer mirror material can be configured to reflect, during an exposure operation of a lithographic apparatus, incident radiation 1080 towards radiation detector 1090. In some aspects, radiation detector 1090 can be configured to sense a reflected portion of incident radiation 1080 (e.g., reflected radiation 1082) used during a wafer exposure operation of a lithographic apparatus.

In some aspects, a set of reference marks can be applied to a region of the multi-layer mirror material. In some aspects, the set of reference marks can include two or more reference marks. In some aspects, a mark (e.g., composed as a thin line with a specific shape (e.g., series of lines) formed by an absorber material, as done on EUV reticles) or a set of marks can be applied to specific regions of the multi-layer mirror material to enhance the detectability, accuracy, or both of the location of fingertip 1024. In some aspects, the data from other radiation detectors described herein can be combined with the data from radiation detector 1090 to remove the separate impact of illumination beam movement.

In some aspects, example illumination uniformity correction system 1000 can further include a processor (not shown) configured to determine a change in a shape of fingertip 1024 based on the received radiation. For example, the processor can be configured to determine a change in a position of optical edge 1024*a* of fingertip 1024 based on a growth of fingertip 1024 in response to an exposure of fingertip 1024 to radiation 1080. In some aspects, the processor can be further configured to measure a change in a position of the reference mark disposed on surface 1025 of fingertip 1024 based on the received radiation. In some aspects, the processor can be further configured to determine the change in the shape of fingertip 1024 based on the measured change in the position of the reference mark. In some aspects, the processor can be further configured to generate a control signal configured to modify a position of fingertip 1024 based on the determined change in the shape of fingertip 1024. In some aspects, the processor can be further configured to transmit the control signal to a motion control system (e.g., including, but not limited to, an actuator) coupled to the finger assembly. In some aspects, the processor may be configured to compare reflected radiation 1082 to a previously-obtained and saved data set to determine finger positions and thereby reduce dose and uniformity errors. As a result, the performance of example illumination uniformity correction system 1000 can be increased based on the increased accuracy and availability of this beam movement data.

Example Processes for Adjusting Illumination Slit Uniformity

Figure 11:
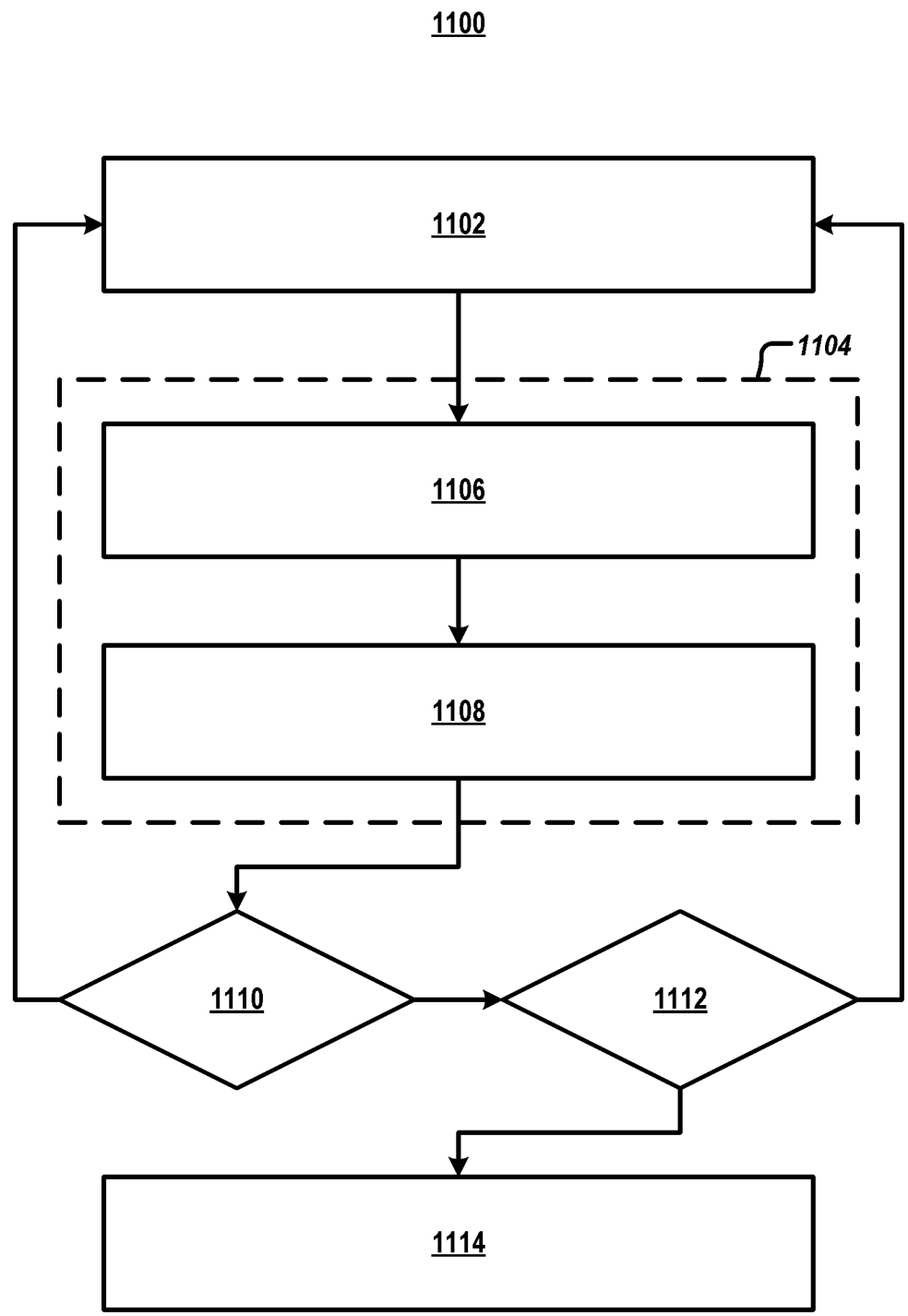
FIG. 11 is an example method for adjusting illumination slit uniformity in a lithographic apparatus according to some aspects of the present disclosure or portion(s) thereof.

FIG. 11 is an example method 1100 for adjusting illumination slit uniformity in a lithographic apparatus according to some aspects of the present disclosure or portion(s) thereof. The operations described with reference to example method 1100 can be performed by, or according to, any of the systems, apparatuses, components, techniques, or combinations thereof described herein, such as those described with reference to FIGS. 1-10 above and FIG. 12 below.

At operation 1102, the method can include moving one or more finger assemblies to correct slit uniformity. In some aspects, the moving of the one or more finger assemblies can be accomplished using suitable mechanical or other methods and include moving the one or more finger assemblies in accordance with any aspect or combination of aspects described with reference to FIGS. 1-10 above and FIG. 12 below.

At operation 1104, the method can include steps performed in parallel to wafer exchange operations (or, in some aspects, wafer exposure operations), including but not limited to measuring and estimating fingertip growth at operation 1106 and correcting finger assembly position if needed at operation 1108.

At operation 1106, the method can include measuring and estimating fingertip growth. For example, at operation 1106, the method can include irradiating, by a radiation source, a portion of a finger assembly with radiation. In some aspects, the radiation can include a laser curtain, and the receiving at least the portion of the radiation can include receiving, by the radiation detector, at least the portion of the transmitted radiation in response to irradiating the portion of the finger assembly with the laser curtain. In some aspects, the portion of the finger assembly can include a mechanical edge of a fingertip of the finger assembly disposed separate from an optical edge of the fingertip of the finger assembly. In some aspects, the irradiating of the portion of the finger assembly can be accomplished using suitable mechanical or other methods and include irradiating the portion of the finger assembly in accordance with any aspect or combination of aspects described with reference to FIGS. 1-10 above and FIG. 12 below.

Further at operation 1106, the method can include receiving, by a radiation detector, at least a portion of the radiation in response to the irradiating of the portion of the finger assembly. In some aspects, the irradiating the portion of the finger assembly can include irradiating, by the radiation source, the portion of the finger assembly with the radiation during a wafer exchange operation of the lithographic apparatus. In other aspects, the irradiating the portion of the finger assembly can include irradiating, by the radiation source, the portion of the finger assembly with the radiation during a wafer exposure operation of the lithographic apparatus. In some aspects, the receiving at least the portion of the radiation can include receiving, by the radiation detector, radiation reflected from a surface of a fingertip of the finger assembly in response to irradiating the surface of the fingertip with the radiation. In some aspects, the receiving of the radiation can be accomplished using suitable mechanical or other methods and include receiving the radiation in accordance with any aspect or combination of aspects described with reference to FIGS. 1-10 above and FIG. 12 below.

Further at operation 1106, the method can include determining, by a processor, a change in a shape of the finger assembly based on the received radiation. In some aspects, the determining the change in the shape of the finger assembly can include determining, by the processor, a change in a position of an optical edge of a fingertip of the finger assembly based on a growth of the fingertip in response to an exposure of the fingertip to DUV radiation or EUV radiation. In some aspects, the determining the change in the shape of the finger assembly can include measuring, by the processor, a change in a position of a reference mark disposed on the finger assembly based on the received radiation. In some aspects, the determining the change in the shape of the finger assembly can further include determining, by the processor, the change in the shape of the finger assembly based on the measured change in the position of the reference mark. In some aspects, the reference mark is applied to a region of a multi-layer mirror material disposed on a fingertip of the finger assembly. For example, in such aspects, the method can include sensing, by the radiation detector, a reflected portion of an actinic EUV light used during a wafer exposure operation of a lithographic apparatus. In some aspects, the determining of the change can be accomplished using suitable mechanical or other methods and include determining the change in accordance with any aspect or combination of aspects described with reference to FIGS. 1-10 above and FIG. 12 below.

At operation 1108, the method can include correcting finger assembly position if needed. For example, at operation 1106, the method can include generating, by the processor, a control signal configured to modify a position of the finger assembly based on the determined change in the shape of the finger assembly. Further at operation 1106, the method can include transmitting, by the processor, the control signal to a motion control system coupled to the finger assembly. In some aspects, the correcting of the finger assembly position can be accomplished using suitable mechanical or other methods and include correcting the finger assembly position in accordance with any aspect or combination of aspects described with reference to FIGS. 1-10 above and FIG. 12 below.

At operation 1110, the method can include determining whether the wafer lot is complete. If not, the method can proceed to operation 1102. If so, the method can proceed to operation 1112. At operation 1112, the method can include determining whether to perform uniformity refresh (UR). If not, the method can proceed to operation 1102. If so, the method can proceed to operation 1114. At operation 1114, the method can include performing UR correction.

Example Computing System

Aspects of the disclosure can be implemented in hardware, firmware, software, or any combination thereof. Aspects of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others. Further, firmware, software, routines, instructions, and combinations thereof can be described herein as performing certain actions. However, it should be appreciated that such descriptions are merely for convenience and that such actions in fact result from computing devices, processors, controllers, or other devices executing the firmware, software, routines, instructions, or combinations thereof and, in doing so, causing actuators or other devices (e.g., servo motors, robotic devices) to interact with the physical world.

Figure 12:
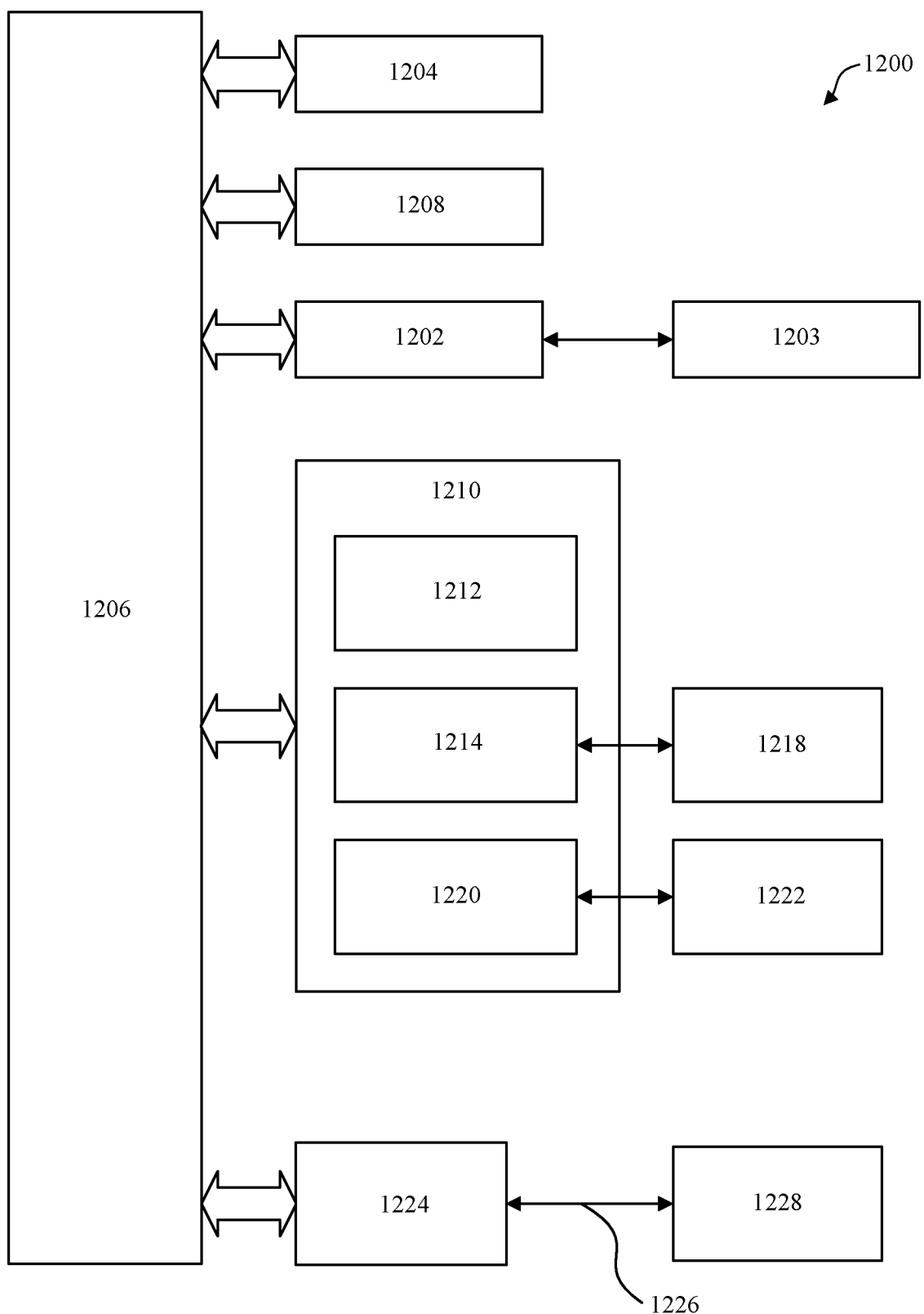
FIG. 12 is an example computer system for implementing some aspects of the present disclosure or portion(s) thereof.

Various aspects can be implemented, for example, using one or more computing systems, such as example computing system 1200 shown in FIG. 12. Example computing system 1200 can be a specialized computer capable of performing the functions described herein such as: the example illumination uniformity correction system 500 shown in FIGS. 5A and 5B; the example illumination uniformity correction system 600 shown in FIG. 6; the example illumination uniformity correction system 700 shown in FIG. 7; the example illumination uniformity correction system 800 shown in FIG. 8; the example illumination uniformity correction system 1000 shown in FIG. 10; any system, sub-system, or component described with reference to FIG. 11; any other suitable system, sub-system, or component; or any combination thereof. Example computing system 1200 can include one or more processors (also called central processing units, or CPUs), such as a processor 1204. Processor 1204 is connected to a communication infrastructure 1206 (e.g., a bus). Example computing system 1200 can also include user input/output device(s) 1203, such as monitors, keyboards, pointing devices, etc., that communicate with communication infrastructure 1206 through user input/output interface(s) 1202. Example computing system 1200 can also include a main memory 1208 (e.g., one or more primary storage devices), such as random access memory (RAM). Main memory 1208 can include one or more levels of cache. Main memory 1208 has stored therein control logic (e.g., computer software) and/or data.

Example computing system 1200 can also include a secondary memory 1210 (e.g., one or more secondary storage devices). Secondary memory 1210 can include, for example, a hard disk drive 1212 and/or a removable storage drive 1214. Removable storage drive 1214 can be a floppy disk drive, a magnetic tape drive, a compact disk drive, an optical storage device, tape backup device, and/or any other storage device/drive.

Removable storage drive 1214 can interact with a removable storage unit 1218. Removable storage unit 1218 includes a computer usable or readable storage device having stored thereon computer software (control logic) and/or data. Removable storage unit 1218 can be a floppy disk, magnetic tape, compact disk, DVD, optical storage disk, and/or any other computer data storage device. Removable storage drive 1214 reads from and/or writes to removable storage unit 1218.

According to some aspects, secondary memory 1210 can include other means, instrumentalities or other approaches for allowing computer programs and/or other instructions and/or data to be accessed by example computing system 1200. Such means, instrumentalities or other approaches can include, for example, a removable storage unit 1222 and an interface 1220. Examples of the removable storage unit 1222 and the interface 1220 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Example computing system 1200 can further include a communications interface 1224 (e.g., one or more network interfaces). Communications interface 1224 enables example computing system 1200 to communicate and interact with any combination of remote devices, remote networks, remote entities, etc. (individually and collectively referred to as remote devices 1228). For example, communications interface 1224 can allow example computing system 1200 to communicate with remote devices 1228 over communications path 1226, which can be wired and/or wireless, and which can include any combination of LANs, WANs, the Internet, etc. Control logic, data, or both can be transmitted to and from example computing system 1200 via communications path 1226.

The operations in the preceding aspects of the present disclosure can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, example computing system 1200, main memory 1208, secondary memory 1210 and removable storage units 1218 and 1222, as well as tangible articles of manufacture embodying any combination of the foregoing. Such control logic, when executed by one or more data processing devices (such as example computing system 1200), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 12. In particular, aspects of the disclosure can operate with software, hardware, and/or operating system implementations other than those described herein.

Embodiments of the present disclosure can be further described by the following clauses.

1. A system, comprising:
   a radiation source configured to:
      generate radiation; and
      transmit the generated radiation towards a finger assembly;
   a radiation detector configured to:
      receive at least a portion of the transmitted radiation; and
   a processor configured to:
      determine a change in a shape of the finger assembly based on the received radiation;
      generate a control signal configured to modify a position of the finger assembly based on the determined change in the shape of the finger assembly; and
      transmit the control signal to a motion control system coupled to the finger assembly.

2. The system of clause 1, wherein the determined change in the shape of the finger assembly comprises a change in a position of an optical edge of a fingertip of the finger assembly based on a growth of the fingertip in response to an exposure of the fingertip to deep ultraviolet (DUV) radiation or extreme ultraviolet (EUV) radiation.

3. The system of clause 1, wherein the radiation source is configured to transmit the radiation during a wafer exchange operation of a lithographic apparatus.

4. The system of clause 1, wherein:
   the generated radiation comprises a laser curtain; and
   the radiation detector is configured to receive at least the portion of the transmitted radiation in response to an irradiation of a portion of the finger assembly by the laser curtain.

5. The system of clause 4, wherein the portion of the finger assembly comprises a mechanical edge of a fingertip of the finger assembly disposed separate from an optical edge of the fingertip of the finger assembly.

6. The system of clause 1, wherein the received radiation comprises radiation reflected from a surface of a fingertip of the finger assembly in response to an irradiation of the surface of the fingertip by the transmitted radiation.

7. The system of clause 1, wherein the processor is configured to:
   measure a change in a position of a reference mark disposed on the finger assembly based on the received radiation; and
   determine the change in the shape of the finger assembly based on the measured change in the position of the reference mark.

8. The system of clause 7, wherein the reference mark is applied to a region of a multi-layer mirror material disposed on a fingertip of the finger assembly.

9. A method for adjusting illumination slit uniformity in a lithographic apparatus, comprising: irradiating, by a radiation source, a portion of a finger assembly with radiation;
   receiving, by a radiation detector, at least a portion of the radiation in response to the irradiating of the portion of the finger assembly;
   determining, by a processor, a change in a shape of the finger assembly based on the received radiation;
   generating, by the processor, a control signal configured to modify a position of the finger assembly based on the determined change in the shape of the finger assembly; and
   transmitting, by the processor, the control signal to a motion control system coupled to the finger assembly.

10. The method of clause 9, wherein the determining the change in the shape of the finger assembly comprises determining, by the processor, a change in a position of an optical edge of a fingertip of the finger assembly based on a growth of the fingertip in response to an exposure of the fingertip to deep ultraviolet (DUV) radiation or extreme ultraviolet (EUV) radiation.

11. The method of clause 9, wherein the irradiating the portion of the finger assembly comprises irradiating, by the radiation source, the portion of the finger assembly with the radiation during a wafer exchange operation of the lithographic apparatus.

12. The method of clause 9, wherein:
   the radiation comprises a laser curtain; and
   the receiving at least the portion of the radiation comprises receiving, by the radiation detector, at least the portion of the transmitted radiation in response to irradiating the portion of the finger assembly with the laser curtain.

13. The method of clause 12, wherein the portion of the finger assembly comprises a mechanical edge of a fingertip of the finger assembly disposed separate from an optical edge of the fingertip of the finger assembly.

14. The method of clause 9, wherein the receiving at least the portion of the radiation comprises receiving, by the radiation detector, radiation reflected from a surface of a fingertip of the finger assembly in response to irradiating the surface of the fingertip with the radiation.

15. The method of clause 9, wherein the determining the change in the shape of the finger assembly comprises:
   measuring, by the processor, a change in a position of a reference mark disposed on the finger assembly based on the received radiation; and
   determining, by the processor, the change in the shape of the finger assembly based on the measured change in the position of the reference mark.

16. The method of clause 15, wherein the reference mark is applied to a region of a multi-layer mirror material disposed on a fingertip of the finger assembly.

17. An apparatus, comprising:
   a finger assembly comprising:
      a finger body;
      a fingertip;
      a multi-layer mirror material disposed on a surface of the fingertip; and
      a set of reference marks applied to a region of the multi-layer mirror material.
18. The apparatus of clause 17, wherein the set of reference marks comprises two or more reference marks.
19. The apparatus of clause 17, wherein the multi-layer mirror material is configured to reflect, during an exposure operation of a lithographic apparatus, deep ultraviolet (DUV) radiation or extreme ultraviolet (EUV) radiation towards a radiation detector.
20. The apparatus of clause 17, wherein the multi-layer mirror material comprises molybdenum.

Although specific reference may be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or can remain without patterning.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

The breadth and scope of the present disclosure should not be limited by any of the above-described example aspects or embodiments, but should be defined only in accordance with the following claims and their equivalents.

The invention claimed is:

1. A system, comprising:
   a radiation source configured to:
      generate radiation; and
      transmit the generated radiation towards a finger assembly;
   a radiation detector configured to:
      receive at least a portion of the transmitted radiation; and
   a processor configured to:
      measure a change in a position of a reference mark disposed on the finger assembly based on the received radiation;
      determine a change in a shape of the finger assembly based on the measured change in the position of the reference mark;
      generate a control signal configured to modify a position of the finger assembly based on the determined change in the shape of the finger assembly; and
      transmit the control signal to a motion control system coupled to the finger assembly.

2. The system of claim 1, wherein the determined change in the shape of the finger assembly based on the measured change in the position of the reference mark comprises a change in a position of an optical edge of a fingertip of the finger assembly based on a growth of the fingertip in response to an exposure of the fingertip to deep ultraviolet (DUV) radiation or extreme ultraviolet (EUV) radiation.

3. The system of claim 1, wherein the radiation source is configured to transmit the radiation during a wafer exchange operation of a lithographic apparatus.

4. The system of claim 1, wherein:
   the generated radiation comprises a laser curtain; and
   the radiation detector is configured to receive at least the portion of the transmitted radiation in response to an irradiation of a portion of the finger assembly by the laser curtain.

5. The system of claim 4, wherein the portion of the finger assembly comprises a mechanical edge of a fingertip of the finger assembly disposed separate from an optical edge of the fingertip of the finger assembly.

6. The system of claim 1, wherein the received radiation comprises radiation reflected from a surface of a fingertip of the finger assembly in response to an irradiation of the surface of the fingertip by the transmitted radiation.

7. The system of claim 1, wherein the reference mark is applied to a region of a multi-layer mirror material disposed on a fingertip of the finger assembly.

8. A method for adjusting illumination slit uniformity in a lithographic apparatus, comprising:
- irradiating, by a radiation source, a portion of a finger assembly with radiation;
- receiving, by a radiation detector, at least a portion of the radiation in response to the irradiating of the portion of the finger assembly;
- measuring, by a processor, a change in a position of a reference mark disposed on the finger assembly based on the received radiation;
- determining, by the processor, a change in a shape of the finger assembly based on the measured change in the position of the reference mark;
- generating, by the processor, a control signal configured to modify a position of the finger assembly based on the determined change in the shape of the finger assembly; and
- transmitting, by the processor, the control signal to a motion control system coupled to the finger assembly.

9. The method of claim 8, wherein the determining the change in the shape of the finger assembly based on the measured change in the position of the reference mark comprises determining, by the processor, a change in a position of an optical edge of a fingertip of the finger assembly based on a growth of the fingertip in response to an exposure of the fingertip to deep ultraviolet (DUV) radiation or extreme ultraviolet (EUV) radiation.

10. The method of claim 8, wherein the irradiating the portion of the finger assembly comprises irradiating, by the radiation source, the portion of the finger assembly with the radiation during a wafer exchange operation of the lithographic apparatus.

11. The method of claim 8, wherein:
- the radiation comprises a laser curtain; and
- the receiving at least the portion of the radiation comprises receiving, by the radiation detector, at least the portion of the transmitted radiation in response to irradiating the portion of the finger assembly with the laser curtain.

12. The method of claim 11, wherein the portion of the finger assembly comprises a mechanical edge of a fingertip of the finger assembly disposed separate from an optical edge of the fingertip of the finger assembly.

13. The method of claim 8, wherein the receiving at least the portion of the radiation comprises receiving, by the radiation detector, radiation reflected from a surface of a fingertip of the finger assembly in response to irradiating the surface of the fingertip with the radiation.

14. The method of claim 8, wherein the reference mark is applied to a region of a multi-layer mirror material disposed on a fingertip of the finger assembly.

* * * * *